United States Patent
Miyamoto et al.

(10) Patent No.: US 6,603,174 B2
(45) Date of Patent: *Aug. 5, 2003

(54) SEMICONDUCTOR DEVICE AND MANUFACTURING METHOD THEREOF

(75) Inventors: Shoichi Miyamoto, Tokyo (JP); Yuuichi Hirano, Tokyo (JP); Takashi Ipposhi, Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/197,705

(22) Filed: Nov. 23, 1998

(65) Prior Publication Data

US 2002/0066928 A1 Jun. 6, 2002

(30) Foreign Application Priority Data

Jun. 22, 1998 (JP) .......................................... 10-174651

(51) Int. Cl.$^7$ ........................... H01L 27/01; H01L 27/12
(52) U.S. Cl. ....................... 257/347; 257/348; 257/349; 257/350; 438/149; 438/219; 438/479
(58) Field of Search ................................. 257/350, 347, 257/348, 349, 296, 506–507; 438/149, 479, 517, 154, 165, 402, 404

(56) References Cited

U.S. PATENT DOCUMENTS

| 5,656,537 A | | 8/1997 | Iwamatsu | |
| 5,920,108 A | * | 7/1999 | Hemmenway et al. | 257/508 |
| 5,985,733 A | * | 11/1999 | Koh et al. | 438/410 |

* cited by examiner

Primary Examiner—Tom Thomas
Assistant Examiner—Donghee Kang
(74) Attorney, Agent, or Firm—Oblon, Spivak, McClelland, Maier & Neustadt, P.C.

(57) ABSTRACT

An SOI substrate (30) comprises a buried oxide film (2), an SOI layer (3) formed on a first region (51) of the surface (2S) of the buried oxide film, and a silicon oxide film (8) formed on a second region (52) of the surface (2S). Formed on the peripheral portion of the SOI layer (3) is a silicon oxide film (6), the side surface (6H) of which is integrally joined to the side surface (8H) of the silicon oxide film (8). The thickness of the peripheral portion of the SOI layer (3) decreases as closer to the end portion (3H) of the SOI layer (3), while the thickness of the silicon oxide film (6) formed on the peripheral portion of the SOI layer (3) increases as closer to the end portion (3H). A gate oxide film (9) is formed on a predetermined region of the surface of the SOI layer (3), and joined to the silicon oxide film (6) at its end portion. A gate electrode (10) is then formed on the surface of the gate oxide film (9) and on a portion where the silicon oxide film (6) is integrally joined to the gate oxide film (9). In this manner, an SOI/MOSFET is obtained with no parasitic element formed at the end portion of the SOI layer.

6 Claims, 18 Drawing Sheets

FIG. 49 (BACKGROUD ART)
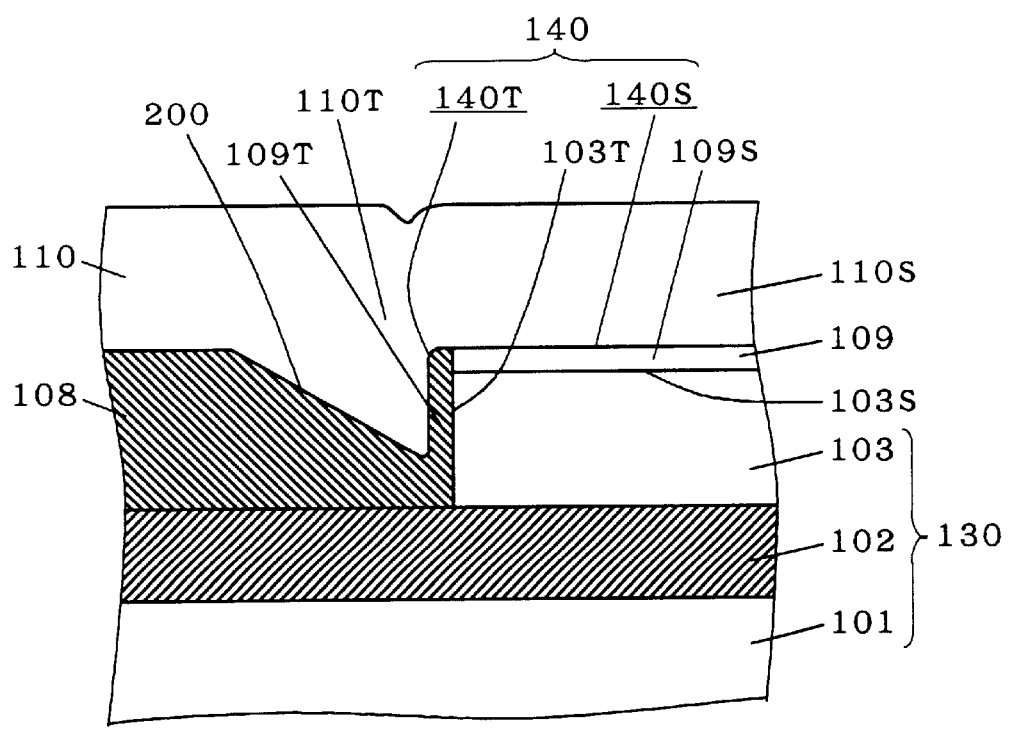

SEMICONDUCTOR DEVICE AND MANUFACTURING METHOD THEREOF

BACKGROUND OF THE INVENTION

1. Field of the Invention

The present invention relates to a semiconductor device and a manufacturing method thereof. More specifically, the present invention relates to a semiconductor device having an SOI (Silicon On Insulator) structure, and a manufacturing method thereof.

2. Background of the Invention

FIGS. 37 through 47 are longitudinal cross-sectional views of a semiconductor device having a conventional SOI structure, showing successive stages of a manufacturing process. Using the drawings, we will describe the structure of a conventional semiconductor device at each step.

First prepared is an SOI substrate 130A shown in FIG. 37, formed for example by an SIMOX (Separation by implanted Oxygen) method. As shown, the SOI substrate 130A comprises a buried oxide film 102 and an SOI layer of single crystalline silicon 103A formed sequentially on one surface of the silicon substrate 101. The SOI substrate 130A may be formed by other methods such as wafer bonding, as long as having such a structure.

Next, as shown in FIG. 38, the surface of the SOI layer 103A in the SOI substrate 130A is oxidized to form a silicon oxide film 104A having a thickness of about 100 Å to 300 Å. And a silicon nitride film 105A having a thickness of about 2000 Å is deposited thereon. The silicon oxide film 104A can be formed by other methods such as CVD using TEOS (Tetra Ethyl Ortho Silicate). The silicon oxide film 104A and the silicon nitride film 105A are then patterned by photolithography and dry etching to form a silicon oxide film (hereinafter referred to also as an "underlying oxide film") 104 and a silicon nitride film 105 as shown in FIG. 39. A region where the underlying oxide film 104 and the silicon nitride film 105 are formed is referred to as an active region 151, while a region except the active region 151 is referred to as an isolation region 152.

After that, the SOI layer 103A is anisotropically etched with the silicon nitride film 105 used as a mask, to form an SOI layer 103 as shown in FIG. 40. The silicon substrate 101, the buried oxide film 102, and the SOI layer 103 after this etching are generically referred to as an "SOI substrate 130".

Then, as shown in FIG. 41, a silicon oxide film 108A having a thickness at least larger than a difference in level between the active region 151 and the isolation region 152 (about 5000 Å, for example) is deposited to cover the overall exposed surface of the SOI substrate 130.

The silicon oxide film 108A is then polished for planarization by a CMP (Chemical Mechanical Polishing) method, as shown in FIG. 42, to the extent that the silicon nitride film 105 is exposed. After the polishing, part of the silicon oxide film 108A remains on the isolation region 152 of the buried oxide film 102, as a silicon oxide film 108B.

Next, the silicon nitride film 105 is removed by phosphoric acid of about 160° C. (see FIG. 43).

Then, after channel implantation through the underlying oxide film 104, the film 104 is removed by hydrofluoric acid. At the same time, the silicon oxide film 108B is etched to a predetermined depth to form a silicon oxide film 108 shown in FIG. 44.

After that, as shown in FIG. 45, a silicon oxide film 109A having a thickness of about 70 Å is formed to cover the exposed surface 103S (cf. FIG. 44) of the SOI layer 103. Subsequently, an electrode layer 110A having a thickness of about 2000 Å is formed as shown in FIG. 46. The silicon oxide film 109A and the electrode layer 110A are then patterned by photolithography and dry etching to form a gate oxide film 109 and a gate electrode 110 shown in FIG. 47. Then, semiconductor regions 120A and 120B each forming a source or drain region are formed by implanting an impurity into a predetermined region. After an interlayer oxide film 111 is formed across the surface of the SOI substrate 130, contact holes CAP and CBP are formed in the surface of the interlayer oxide film 111 so as to reach the source or drain regions 120A and 120B, respectively, as shown in FIG. 47. The contact holes CAP and CBP are filled with a wiring material, such as aluminum, to form wires 112A and 112B, respectively. In this manner, the SOI/MOSFET shown in FIG. 47 is obtained.

According to the manufacturing process described above, when the underlying oxide film 104 in the semiconductor device shown in FIG. 43 is removed by etching using hydrofluoric acid, the silicon oxide film 108B is etched at the same time. Since the etch rate of the silicon oxide film 108B is larger than that of the underlying oxide film 104 formed by thermal oxidation, the silicon oxide film 108B will be overetched in the vicinity of the $Si/SiO_2$ interface between the SOI layer 103 and the silicon oxide film 108B. This makes that portion of the silicon oxide film 108B smaller in height (thickness) than the SOI layer 103. Such a portion will be referred to as a depression 200.

FIG. 48 is a longitudinal cross-sectional view taken along a line X—X in FIG. 47, when viewed from the direction indicated by the arrow. FIG. 49 is an enlarged cross-sectional view showing a vicinity of the depression 200 in FIG. 48 (a region AP indicated by dashed lines).

In the semiconductor device with the depression 200 shown in FIG. 44, when the silicon oxide film 109A and the electrode layer 110A are sequentially formed on the surface 103S of the SOI layer 103, their shapes will be affected by the depression 200 as shown in FIG. 46. Accordingly, the depression 200 will affect the shapes of the gate oxide film 109 and the gate electrode 110 which are obtained by patterning the silicon oxide film 109A and the conductive material 110A, as shown in FIG. 48.

A conventional MOSFET 140 with the depression 200, as shown in FIG. 49, comprises not only a real MOSFET 140S but also a parasitic MOSFET 140T formed at the end portion of the SOI layer 103. More specifically, the real MOSFET 140S has a gate electrode structure comprising a gate oxide film 109S and a gate electrode 110S formed on the surface 103S of the SOI layer 103, and the parasitic MOSFET 140T has a gate electrode structure comprising a gate oxide film 109T and a gate electrode 110T formed on the side surface 103T of the SOI layer 103.

Since an electric field is applied both to the real MOSFET 140S and to the parasitic MOSFET 140T, a large electric field is applied to the end portion of the SOI layer 103 in the conventional MOSFET 140. This causes, with lower voltage than the threshold value of the real MOSFET 140S, a flow of drain current at the end portion of the conventional MOSFET 140 (problem (1)). That is, there has been a problem that the conventional MOSFET 140 with the depression 200 cannot ensure designed device characteristics due to the parasitic MOSFET 140T.

Further, a strong electric field to be applied to the end portion of the conventional MOSFET 140 is likely to cause degradation in insulation of the gate oxide film 109, namely, the gate oxide films 109T and 109S, in the vicinity of the end portion (problem (2)). This may cause improper operation of the conventional MOSFET 140 even with relatively low gate voltage.

Further, in the conventional MOSFET 140 as shown in FIG. 49, the SOI layer 103 and the silicon oxide film 108 under the bottom of the depression form an $Si/SiO_2$ interface. Since the silicon oxide film 108 is a film formed by deposition such as CVD, the $Si/SiO_2$ interface has relatively a lot of interface states. Thus, a large difference in potential between the bottom of the depression 200 and the SOI layer 103 is likely to cause degradation in insulation of the silicon oxide film 108 at the $Si/SiO_2$ interface (problem (3)). Such degradation in insulation at the interface equals degradation in insulation of the parasitic MOSFET 140T, thereby resulting in degradation in insulation of the conventional MOSFET 140 itself. Consequently, the conventional MOSFET 140 will not function normally.

SUMMARY OF THE INVENTION

A first aspect of the present invention is directed to a semiconductor device comprising: a first insulating layer; a semiconductor layer formed on a first region of a surface of the first insulating layer; a second insulating layer formed on a second region of the surface of the first insulating layer, the second region being adjacent to the first region; a third insulating layer formed on a peripheral portion of the semiconductor layer, and integrally joined to the second insulating layer adjacent thereto at its end portion; a fourth insulating layer formed across a third region of a surface of the semiconductor layer, and integrally joined to the third insulating layer at its end portion which intersects with the longitudinally extending the third insulating layer, the third region being opposed to the first region and surrounded by the peripheral portion; a control electrode layer formed on a surface of the fourth insulating layer and on a portion where the third insulating layer is integrally joined to the fourth insulating layer; a first semiconductor region having a first impurity of a predetermined conductivity type, formed in a fourth region of the surface of the semiconductor layer, the fourth region being adjacent to the third region; and a second semiconductor region having a second impurity of the predetermined conductivity type, formed in a fifth region of the surface of the semiconductor layer, the fifth region being adjacent to the third region so as to sandwich the third region between the fourth region and itself. The thickness of the peripheral portion of the semiconductor layer decreases as closer to the end portion of the semiconductor layer, while the thickness of the third insulating layer increases as closer to the end portion of the semiconductor layer.

According to a second aspect of the present invention, the semiconductor device of the first aspect further comprises: a fifth insulating layer formed on the end portion of the semiconductor layer, and on the second region of the surface of the first insulating layer in the vicinity of the end portion of the semiconductor layer. The fifth insulating layer has a first side surface joined to the end portion of the semiconductor layer, and a second side surface opposed to the first side surface. The second side surface is integrally joined to a side surface of the second insulating layer on the side of the semiconductor layer. On the top surface of the fifth insulating layer which is opposed to the bottom surface forming an interface along with the surface of the first insulating layer, the third insulating layer is extended from the end portion of the semiconductor layer. The end portion of the third insulating layer is integrally joined to the side surface of the second insulating layer.

According to a third aspect of the present invention, in the semiconductor device of the first aspect, the second insulating layer comprises a sixth insulating layer and a seventh insulating layer. The sixth insulating layer is formed at least on the end portion of the semiconductor layer and on the end portion of the third insulating layer, and integrally joined to the third insulating layer. The seventh insulating layer formed to be adjacent to and integrally joined to the sixth insulating layer.

A fourth aspect of the present invention is directed to a semiconductor device having a trench isolation structure comprising a first insulating layer, a semiconductor layer formed on a first region of a surface of the first insulating layer, and a second insulating layer formed on a second region surrounding the first region to be adjacent to the semiconductor layer. In the device, the second insulating layer is formed on a peripheral portion of the semiconductor layer. Further, a thickness of the peripheral portion of the semiconductor layer decreases as closer to an end portion of the semiconductor layer, while a thickness of the second insulating layer formed on the peripheral portion of the semiconductor layer increases as closer to the end portion of the semiconductor layer.

A fifth aspect of the present invention is directed to a method of manufacturing a semiconductor device. The method comprises: a first step of preparing an underlying layer comprising a first insulating layer and a semiconductor layer formed on a surface of the first insulating layer; a second step of forming a second insulating layer on a surface of a first portion of the semiconductor layer which is located above a first region of the surface of the first insulating layer, and forming a stopper film across a surface of the second insulating layer; a third step of forming a third insulating layer joined to the second insulating layer, on and in a surface of a second portion of the semiconductor layer which is located above a second region of the surface of the first insulating layer, the second region being adjacent to and surrounding the first region; a fourth step of forming a sidewall adjacent to a side surface of the stopper film, on a first portion of the third insulating layer which is located above a third region of the surface of the first insulating layer, and removing a second portion of the third insulating layer, the third region being within the second region and being adjacent to and surrounding the first region; a fifth step of removing the second portion of the semiconductor layer which is located above the second region except the third region; a sixth step of forming a fourth insulating layer on the second region of the first insulating layer, on a side surface of the semiconductor layer, on the side surface of the third insulating layer, and on a side surface of the sidewall; a seventh step of removing only the stopper film; and an eighth step of removing the exposed second insulating layer, the sidewall, and part of the fourth insulating layer that ranges in height from its surface to a surface of the third insulating layer adjacent to the sidewall.

According to a sixth aspect of the present invention, in the method of the fifth aspect, the sidewall consists essentially of a first sidewall and a second sidewall. Further, the fourth step comprises: a step of forming the first sidewall on the first portion of the third insulating layer and on the side surface of the stopper film; and a step of forming the second sidewall on a surface of the first sidewall to form the sidewall.

According to a seventh aspect of the present invention, in the method of the fifth aspect, the eighth step comprises: a step of forming a third sidewall on an exposed side surface of the sidewall and on a surface of the second insulating layer exposed at the seventh step, in the vicinity of the side surface of the sidewall; and a step of removing the second insulating layer, the sidewall, the third sidewall, and part of the fourth insulating layer that ranges in height from its surface to the surface of the third insulating layer adjacent to the sidewall.

In the semiconductor device of the first aspect, the third insulating layer is formed on the peripheral portion of the semiconductor layer. Further, the thickness of the peripheral portion of the semiconductor layer decreases as closer to the end portion of the semiconductor layer, while the thickness of the third insulating layer increases as closer to the end portion of the semiconductor layer. Besides, the third insulating layer is integrally joined to the adjacent second insulating layer at its end portion. Thus, the semiconductor device according to the first aspect includes no depression at the interface between the semiconductor layer and the second insulating layer as found in the conventional semiconductor device. This prevents a parasitic element to be formed at the end portion of the semiconductor device due to a depression. Therefore, the semiconductor device according to the first aspect can resolve the problems of the conventional semiconductor device that the parasitic element prevents the device from obtaining designed device characteristics and causes degradation in insulation of the fourth insulating layer.

Further, since the peripheral portion of the semiconductor layer and the third insulating layer are in such a shape as described above, concentration of an electric field in the vicinity of the peripheral portion of the semiconductor device can be relieved with voltage applied to the control electrode. Thus, it is possible to increase reliability of the fourth insulating layer, i.e., reliability of the semiconductor device itself, as compared with the conventional semiconductor device.

As described above, the semiconductor device according to the first aspect can certainly ensure the designed device characteristics as compared with the conventional semiconductor device.

In the semiconductor device of the second aspect, there exists the fifth insulating layer as well as the third insulating layer between the semiconductor layer and the second insulating layer. These second, third, and fifth insulating layers are integrally joined to each other at each interface. Thus, the semiconductor layer is not in direct contact with the second insulating layer. This certainly brings about the effect of the first aspect.

In the semiconductor device of the third aspect, the sixth insulating layer forming part of the second insulating layer is formed at least on the end portion of the semiconductor layer and on the end portion of the third insulating layer, and is integrally joined to the third insulating layer. Thus, the semiconductor layer is not in direct contact with the seventh insulating layer forming part of the second insulating layer. This certainly brings about the effect of the first aspect.

The semiconductor device of the fourth aspect can obtain the same effect as that of the first aspect.

In the manufacturing method of the fifth aspect, at the third step, the third insulating layer joined to the second insulating layer is formed on and in the surface of the second portion of the semiconductor layer, and at the fourth step, the sidewall is formed on the first portion of the third insulating layer. Thus, unlike the conventional method, it is possible to fully protect the interface between the semiconductor layer and the third or fourth insulating layer, when the fourth insulating layer is formed at the sixth step. This prevents formation of a depression at that interface, thereby preventing formation of a parasitic element due to such a depression.

In the manufacturing method of the sixth aspect, the sidewall consists essentially of the first sidewall and the second sidewall. This further increases the effect of the fifth aspect.

In the manufacturing method of the seventh aspect, at the eighth step, after the third sidewall is formed, the second insulating layer, the sidewall, and the third sidewall, and a predetermined portion of the fourth insulating layer is removed. This further increases the effect of the fifth aspect.

The present invention is directed to solve the aforementioned problems (1) to (3) of the conventional MOSFET. An object of the present invention is to provide a semiconductor device having an SOI structure with no parasitic element at the end portion of a semiconductor layer.

To achieve this object, another object of the present invention is to provide a manufacturing method of such a device, which can prevent formation of a depression causing a parasitic element.

These and other objects, features, aspects and advantages of the present invention will become more apparent from the following detailed description of the present invention when taken in conjunction with the accompanying drawings.

BRIEF DESCRIPTION OF THE DRAWINGS

FIG. 49 is an enlarged longitudinal cross-sectional view schematically showing the structure of the semiconductor device according to the conventional technique.

DESCRIPTION OF THE PREFERRED EMBODIMENTS

1. First Preferred Embodiment

FIGS. 1 through 15 are longitudinal cross-sectional views of a semiconductor device, showing successive stages of a manufacturing method according to a first preferred embodiment of the present invention. Using the drawings, we will describe each step in a manufacturing process to disclose the features of a semiconductor device according to the first preferred embodiment.

1-1. First Step

Figure 1:
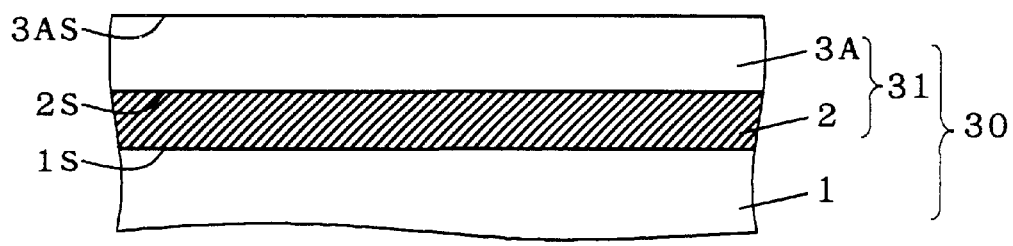
FIGS. 1 to 15 are longitudinal cross-sectional view of a semiconductor device, showing successive stages of a manufacturing method according to a first preferred embodiment of the present invention.

At the first step, a substrate 30 having an SOI (Silicon on Insulation) structure is prepared as shown in FIG. 1. More specifically, a silicon substrate 1 is prepared, on the surface 1S of which a silicon oxide film 2 is formed as a first insulating layer, on the surface 2S of which a single crystalline silicon layer 3A is formed as a semiconductor layer. The silicon oxide film 2 is also referred to as a buried oxide film 2, and the single crystalline silicon layer 3A as an SOI layer 3A. When the buried oxide film (first insulating layer) 2 and the SOI layer (semiconductor layer) 3A are defined generally as an "underlying layer 31", it can be said that the first step is a step of preparing the underlying layer 31. Although various kinds of processing are applied to the underlying layer 31 (especially to the SOI layer 3A) at the following steps, as long as the layer has the aforementioned structure mainly consisting of the buried oxide film 2 and the SOI layer 3A, it is referred to as the "underlying layer 31". Further, the substrate 30 having an SOI structure with the underlying layer 31 is also referred to as an "SOI substrate 30".

The SOI substrate 30 or the underlying layers 31 can be formed by an SIMOX (Separation by Implanted Oxygen) method, or by wafer bonding, or by any other method.

1-2. Second Step

Figure 2:
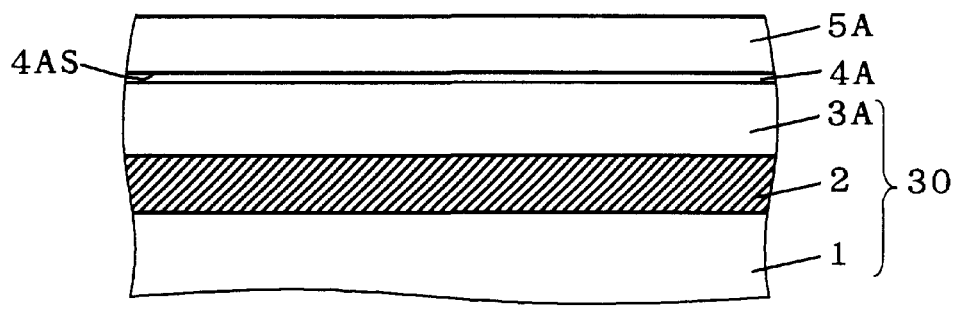

Next, as shown in FIG. 2, the overall surface 3AS (cf. FIG. 1) of the SOI layer 3A is thermally oxidized to form a silicon oxide film 4A having a thickness of about 100 Å to 300 Å as a second insulating layer. The silicon oxide film 4A may be formed by other methods such as a CVD (Chemical Vapor Deposition) method using TEOS (Tetra Etyle Ortho Silicate). Further, the silicon oxide film 4A is also referred to as an "underlying oxide film 4A".

Next, as shown in FIG. 2, a silicon nitride film 5A having a thickness of about 2000 Å is deposited as a stopper film across the surface 4AS of the underlying oxide film 4A.

Figure 3:
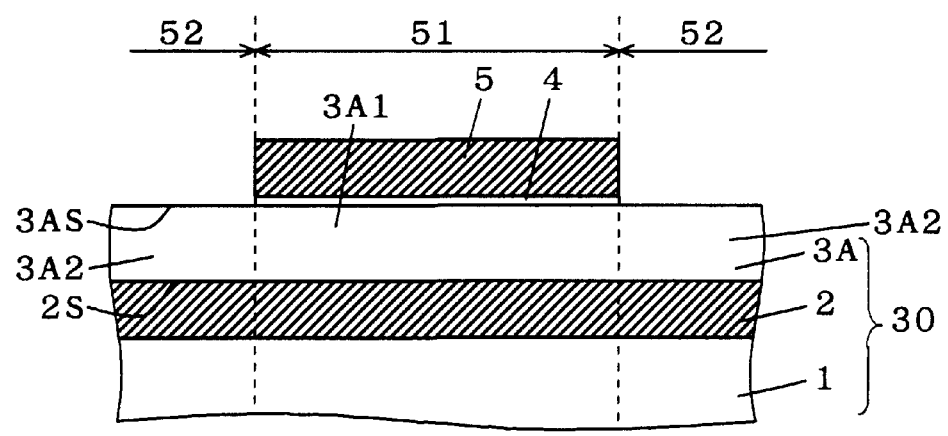

The silicon nitride film 5A and the underlying oxide film 4A are then patterned by photolithography and dry etching to form a silicon nitride film 5 as a stopper film, and an underlying oxide film 4, as shown in FIG. 3. More specifically, the underlying oxide film 4 and the silicon nitride film (hereinafter referred to also as a stopper film) 5 are formed on a first region 51 of the surface 2S of the buried oxide film 2.

Here, from the viewpoint of a finally completed device, the concept of the first region 51 includes not only a two-dimensional region on the surface 2S of the buried oxide film 2 but also a three-dimensional region in a direction perpendicular to the surface 2S of the silicon substrate 1. This applies to other second through fifth regions in the following description. The same can be said of the following modifications of the first preferred embodiment and a modification of a second preferred embodiment which will be described later. The first region 51 is also referred to as an "active region 51".

1-3. Third Step

Figure 4:
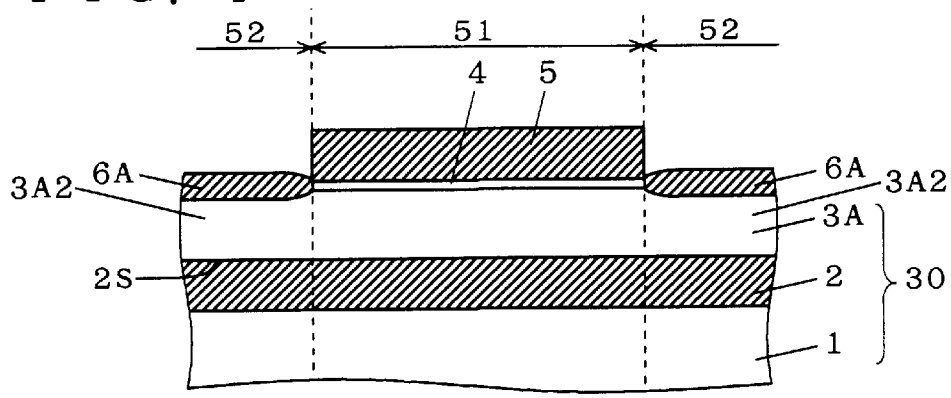

Next, as shown in FIG. 4, the exposed surface 3AS (cf. FIG. 3) of the SOI layer 3A in a region 52 which is not covered with the silicon nitride film 5 is oxidized to form a silicon oxide film 6A having a thickness of about several hundred angstroms on and in the surface 3AS of the SOI layer 3A. Here, the underlying oxide film 4A in the first region 51 is especially referred to as an "underlying oxide film (second insulating layer) 4". Further, the region 52 is basically defined as a region of the surface 2S of the buried oxide film 2, which is adjacent to and surrounding the first region 51, and hereinafter referred to as a "second region 52" or an "isolation region 52".

At this time, the end portions of the underlying layer 4 and the silicon oxide film 6A are integrally joined to each other at the interface between the first region 51 and the second region 52. Further, as shown in FIG. 4, the silicon oxide film 6A has a thickness that increases with distance from the interface between the first region 51 and the second region 52 to be almost constant at a predetermined distance therefrom.

In this manner, this third step is taken as a step of forming the silicon oxide film (third insulating layer) 6A joined to the underlying oxide film (second insulating layer) 4, on and in the surface of a second portion 3A2 of the SOI layer (semiconductor layer) 3A which is located above the second region 52 of the surface 2S of the buried oxide film (first insulating layer) 2. In this respect, the aforementioned second step is taken as a step of forming the underlying oxide film (second insulating layer) 4 on the surface of a first portion 3A1 of the SOI layer 3A which is located above the first region 51 of the surface 2S of the buried oxide film 2, and forming the stopper film 5 across the surface of the underlying oxide film 4.

1-4. Fourth Step

Figure 5:
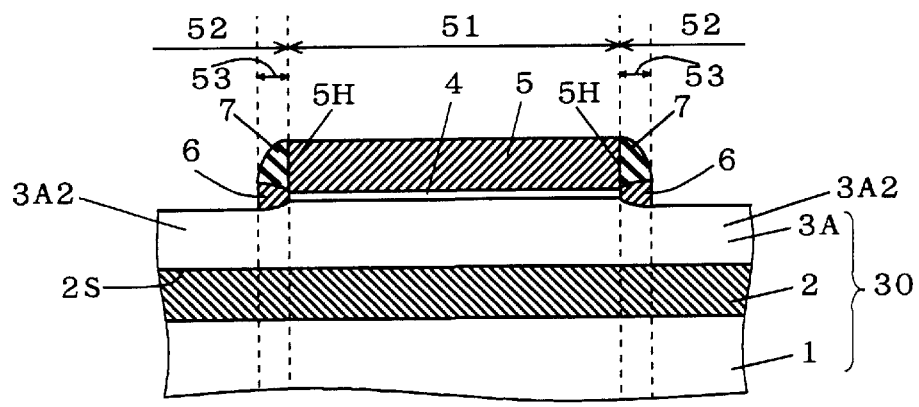

At the fourth step, as shown in FIG. 5, a sidewall 7 is formed, abutting on the side surface 5H of the stopper film 5, on a first portion (corresponding to a silicon oxide film 6 which will be described later) of the silicon oxide film (third insulating layer) 6A which is located above a third region 53 of the surface 2S of the buried oxide film (first insulating layer) 2. Formed within the second region 52, the third region 53 is adjacent to and surrounds the first region 51.

More specifically, in the semiconductor device shown in FIG. 4, a silicon oxide film having a thickness of about 500 Å is deposited by a CVD method using TEOS as a material, for example, to cover the surface of the silicon oxide film 6A and the surface and side surfaces of the stopper film 5. The silicon oxide film is then anisotropically etched to form the sidewall 7 in a self-alignment manner. At the same time, a portion (second portion) of the silicon oxide film (third insulating layer) 6A which is located above the second region 52 of the buried oxide film 2 except the third region 53 is etched. Thus, the residual silicon oxide films 6A after the fourth step, or the portion of the silicon oxide film 6A located above the third region 53 of the buried oxide film 2, is referred to as a "silicon oxide film 6".

1-5. Fifth Step

At the fifth step, anisotropic etching is applied to the semiconductor device shown in FIG. 5, using the sidewall 7 and the stopper film 5 as masks. This removes the second portion 3A2 of the SOI layer (semiconductor layer) 3A which is located above the second region 52 of the buried oxide film 2 except the third region 53, to form an "SOI layer 3" with the surface of its peripheral portion inclined downwardly (see FIG. 6).

1-6. Sixth Step

Figure 6:
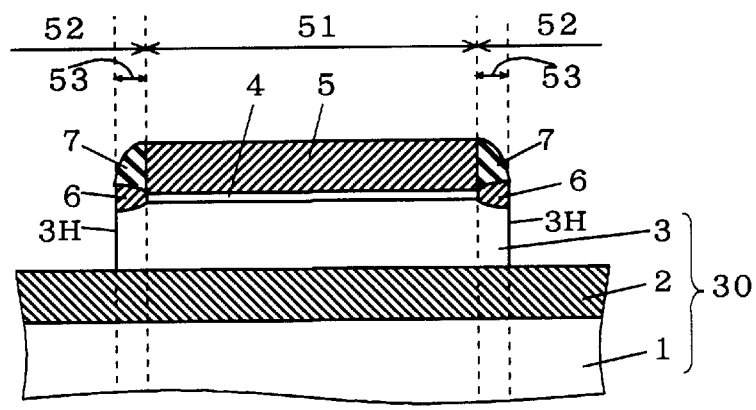
Figure 7:
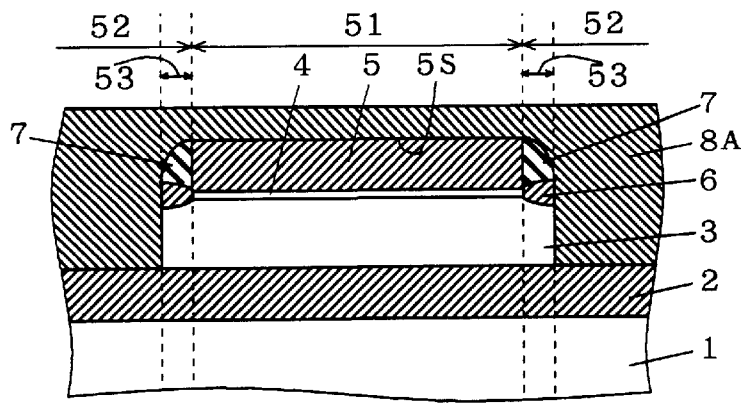

Next, as shown in FIG. 7, in the semiconductor device shown in FIG. 6, a silicon oxide film 8A having a thickness of about 5000 Å is deposited by a CVD method using TEOS as a material, to cover across the exposed surfaces of the buried oxide film 2, the silicon oxide films 6, the sidewalls 7, and the stopper film 5.

Figure 8:
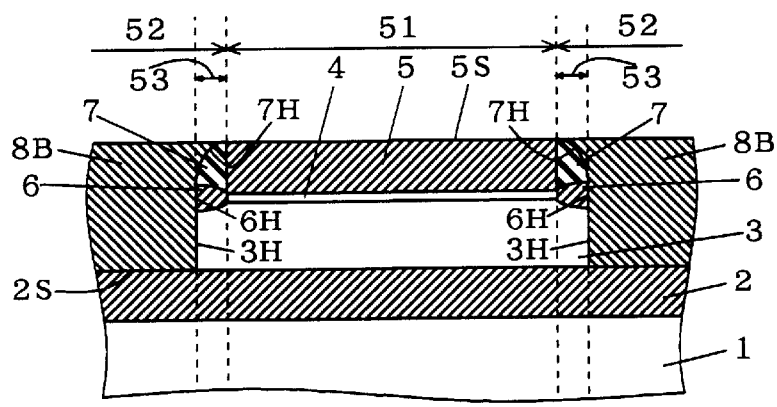

Then, as shown in FIG. 8, the silicon oxide film 8A (cf. FIG. 7) is polished for planarization by a CMP (Chemical Mechanical Polishing) method using the silicon nitride film 5 as a stopper film, to the extent that the surface 5S of the silicon nitride film 5 is exposed. At this time, a silicon oxide film (fourth insulating layer) 8B obtained after the polishing is formed on the second region 52 of the surface 2S of the buried oxide film (first insulating layer) 2, on the side surface 3H of the SOI layer 3, on the side surface 6H of the silicon oxide film (third insulating layer) 6, and on the side surface 7H of the sidewall 7.

1-7. Seventh Step (Step 1)

After that, only the silicon nitride film (stopper film) 5 is removed by phosphoric acid of about 160° C. (see FIG. 9).

(Step 2)

Then, annealing is applied to the SOI layer 3 after an impurity such as boron (B) is implanted therein through the underlying oxide film 4. This forms a P type conductivity type (referred to as a second conductivity type) of SOI layer 3.

1-8. Eighth Step

Figure 9:
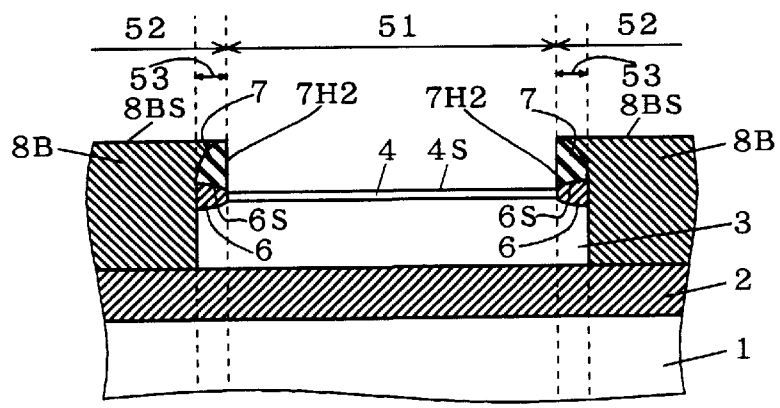
Figure 10:
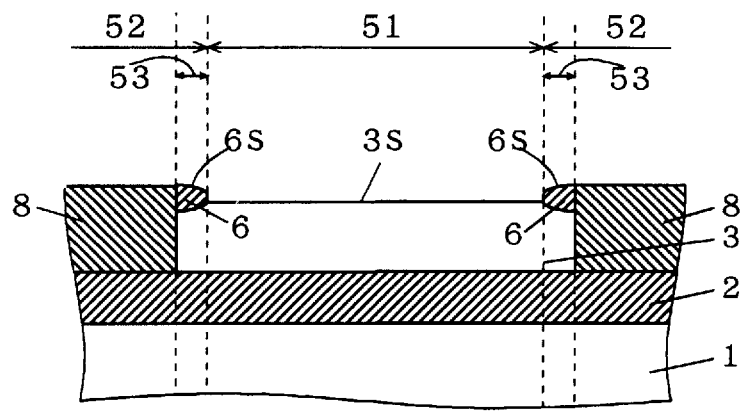

Next, at the eighth step, the exposed underlying oxide film (second insulating layer) 4 is removed by wet etching using hydrofluoric acid (see FIG. 10). At the same time, the sidewall 7 and part of the silicon oxide film (fourth insulating layer) 8B that ranges from the surface 8BS to the surface 6S of the silicon oxide film (third insulating layer) 6 abutting on the sidewall 7, both shown in FIG. 9, are removed as shown in FIG. 10.

Especially, according to the manufacturing method of the first preferred embodiment, the silicon oxide film 6, the silicon oxide film 8B, and the sidewall 7 are integrally joined to each other. Thus, the topmost surface to be wet etched by hydrofluoric acid is the side surface 7H2 of the sidewall 7 which is opposed to the silicon oxide film 8B. That is, the topmost surface to be etched can be located away from the Si/SiO$_2$ interface between the SOI layer 3 and the silicon oxide film 8B, as compared with the conventional manufacturing method. This allows the Si/SiO$_2$ interface to be fully protected during wet etching.

Besides, while the underlying oxide film 4 is about 100 Å to 300 Å thick, the sidewall 7 and the silicon oxide film 8B to be etched (cf. FIGS. 9, 10) are about 2000 Å thick which is equivalent to the stopper film 5 (cf. FIG. 8). Thus, the underlying oxide film 4 can be removed completely during a period of time the sidewall 7 and the silicon oxide film 8B to be etched are etched.

Further, the silicon oxide film 6 which is formed by thermal oxidation has a lower etch rate to hydrofluoric acid than the silicon oxide films 7 and 8B which are formed by deposition such as CVD. Thus, even if the underlying oxide film 4 is not completely removed during that period, the silicon oxide film 6 thicker than the residual underlying oxide film 4 will be hardly etched before the residual underlying oxide film 4 is removed.

Figure 44:
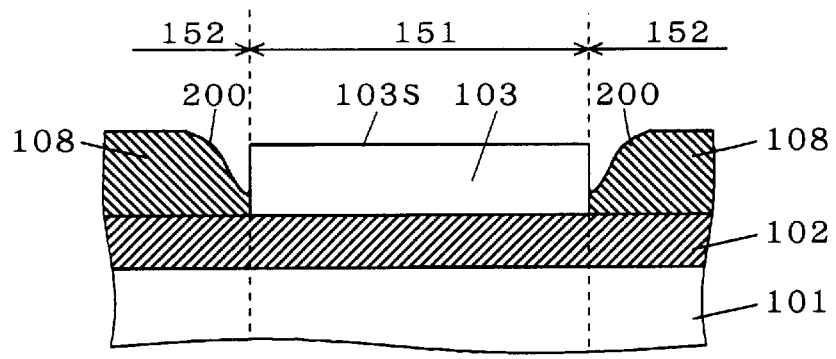
Figure 45:
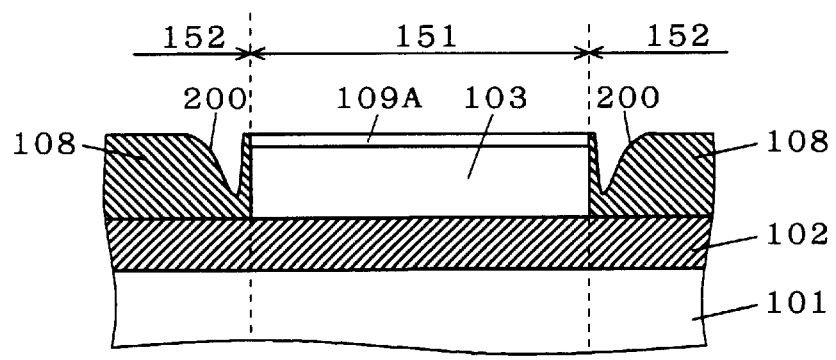
Figure 46:
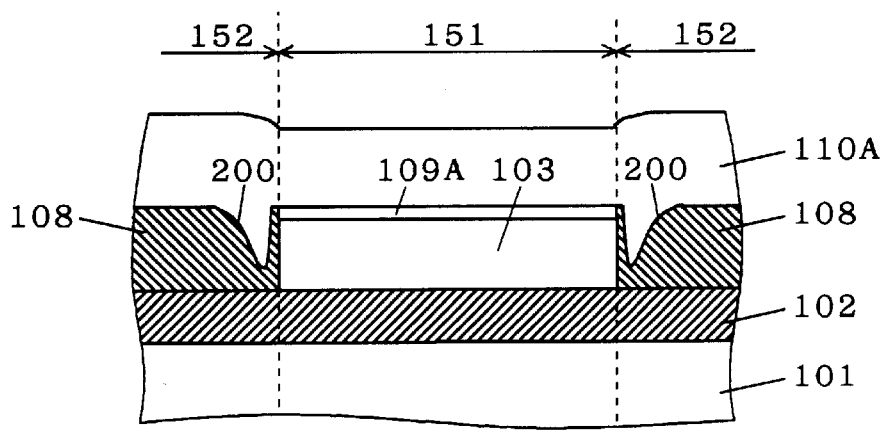

This effectively prevents generation of a depression (c.f., depression 200 in FIGS. 44 or 49) at the Si/SiO$_2$ interface between the SOI layer 3 and the silicon oxide film 8B.

Further, since the silicon oxide film 8B is formed to be integrally joined to the silicon oxide film 6, even if the silicon oxide film 8B shown in FIG. 9 is etched to the same level as the surface 6S of the silicon oxide film 6 as shown in FIG. 10, there occurs no depression at the interface between the silicon oxide films 6 and 8 as well as at the interface between the SOI layer 3 and the silicon oxide film 8.

1-9. Ninth Step

Figure 11:
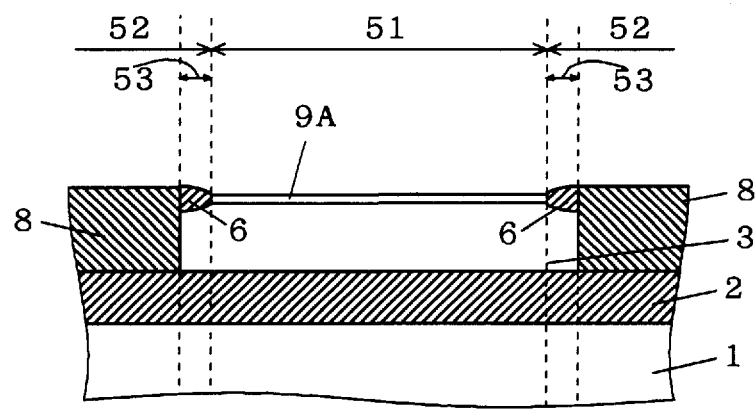
Figure 12:
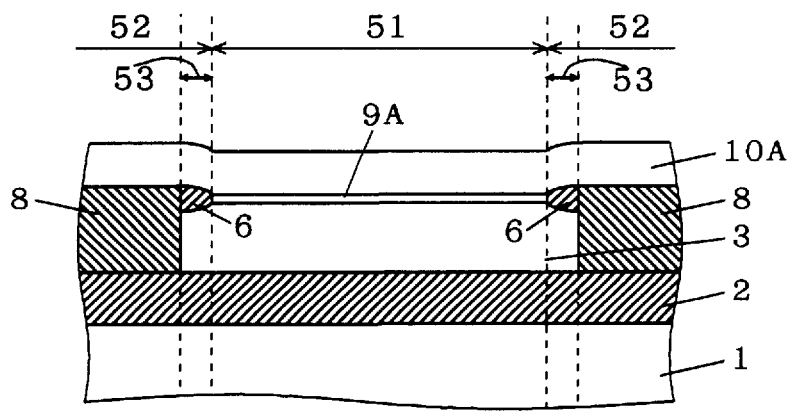

At the ninth step, as shown in FIG. 11, a silicon oxide film 9A having a thickness of about 70 Å is formed across the surface 3S of the SOI layer 3 shown in FIG. 10. Then, as shown in FIG. 12, an electrode layer of polycrystalline silicon 10A having a thickness of about 2000 Å is formed across the surfaces of all the silicon oxide films 6, 8 and 9A. The silicon oxide film 9A and the electrode layer 10A are then patterned by photolithography to form a gate oxide film 9 and a gate electrode layer (control electrode layer) 10 shown in FIG. 13.

1-10. Tenth Step

Figure 13:
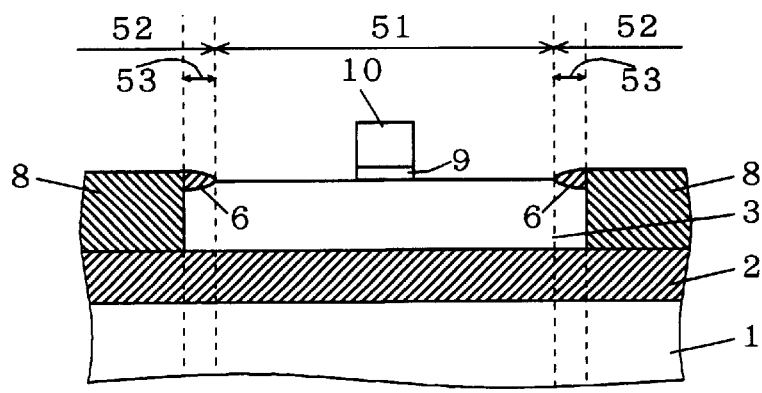

Next, annealing is applied to the semiconductor device shown in FIG. 13 after an N conductivity type (referred to as a first conductivity type) of impurity such as phosphorus (P) is implanted therein. This forms, as shown in FIG. 14, semiconductor regions 20A and 20B of the first conductivity type each forming a source or drain region.

1-11. Eleventh Step

Figure 14:
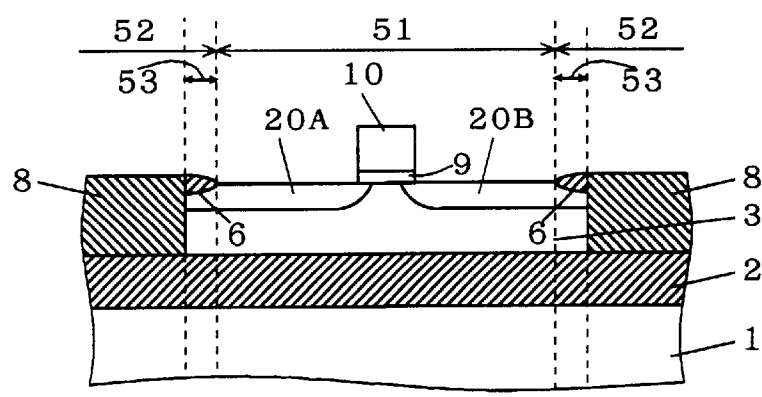
Figure 15:
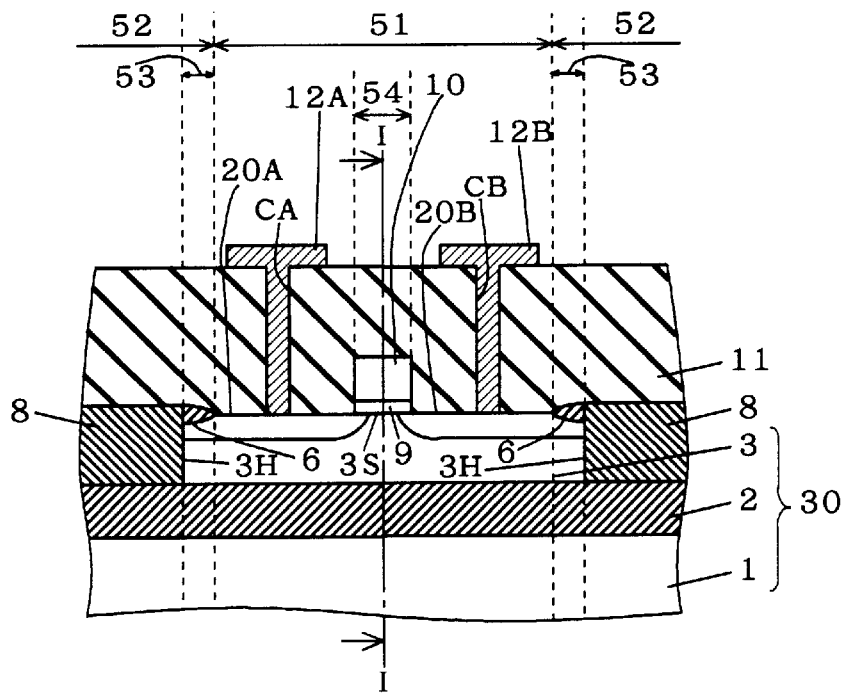

After that, as shown in FIG. 15, an interlayer oxide film 11 is formed across the exposed surface of the semiconductor device shown in FIG. 14. Then formed in the surface of the interlayer oxide film 11 are contact holes CA and CB reaching the semiconductor regions 20A and 20B, respectively. The contact holes CA and CB are filled with a conductive material such as aluminum to form wires 12A and 12B, respectively. At this time, the gate electrode layer 10 is drawn out on the interlayer oxide film 11 through the conductive material filling the contact holes (not shown).

In this manner, the semiconductor device (SOI/MOSFET) having a structure shown in FIG. 15 is obtained.

Figure 16:
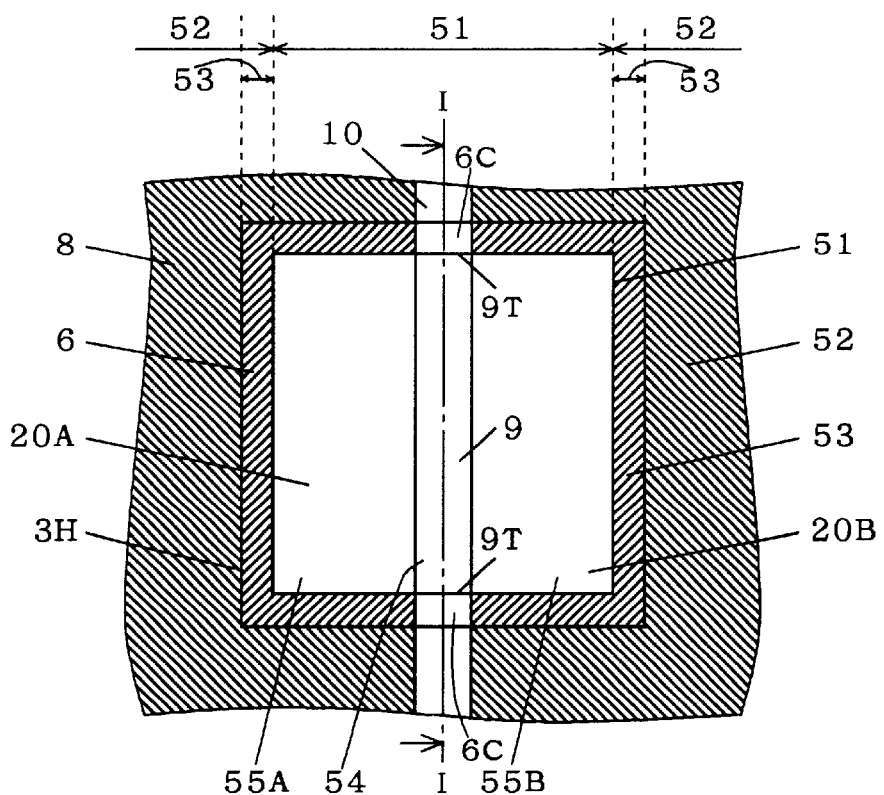
FIG. 16 is a top view schematically showing the structure of the semiconductor device according to the first preferred embodiment.
Figure 17:
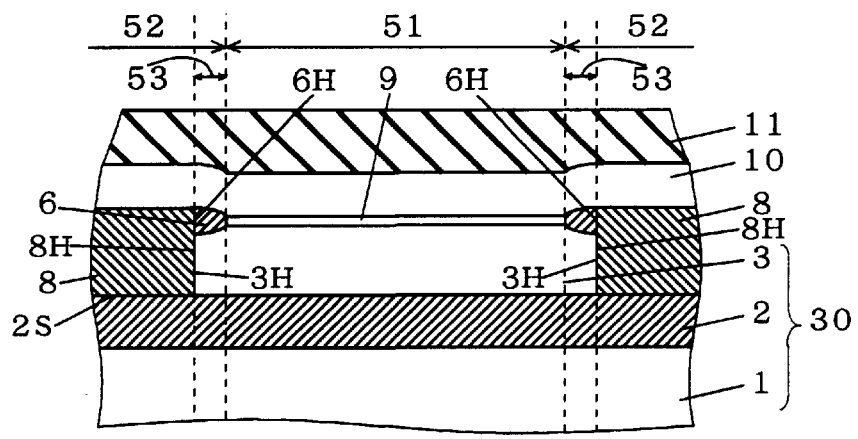
FIG. 17 is a longitudinal cross-sectional view schematically showing the structure of the semiconductor device according to the first preferred embodiment.

The features of the semiconductor device (SOI/MOSFET) in FIG. 15 will be described, referring to FIGS. 15 to 17. FIG. 16 is a top view schematically showing the semiconductor device in FIG. 15, especially showing the inside of the surface 3S of the SOI layer 3. FIG. 17 is a longitudinal cross-sectional view taken along a line I—I in FIG. 16, when viewed from the direction of the arrow.

As shown in FIGS. 15 to 17, the semiconductor device according to the first preferred embodiment comprises the buried oxide film (first insulating layer) 2, the SOI layer (semiconductor layer) 3 formed on the first region 51 of the surface 2S of the buried oxide film 2, and the silicon oxide film (second insulating layer) 8 formed on the second region 52 of the surface 2S of the buried oxide film 2. The second region 52 is adjacent to the first region 51.

Especially, the silicon oxide film (third insulating layer) 6 is formed on the peripheral portion of the SOI layer 3. The end portion or side surface 6H of the silicon oxide film 6 is integrally joined to the end portion or side surface 8H of the silicon oxide film 8.

Then, the gate oxide film (fourth insulating layer) 9 is formed on a fourth region 54 of the surface 3S of the SOI layer 3. The fourth region 54 is opposed to the first region 51 of the surface 2S of the buried oxide film 2 and surrounded by the peripheral portion of the SOI layer 3. The gate oxide film 9 is integrally joined to the silicon oxide film 6 at its end portion or side surface 9T which intersects with the longitudinally extending silicon oxide film 6. Further, the gate electrode (control electrode layer) 10 is formed on the surface of the gate oxide film 9 and on a portion 6C where the silicon oxide film 6 is integrally joined to the gate oxide film 9.

Further, the source or drain region (first semiconductor region) 20A having a first impurity of an N conductivity type (predetermined conductivity type) such as phosphorus (P), is formed in a fifth region 55A of the surface 3S of the SOI layer 3. The fifth region 55A is adjacent to the fourth region 54. Similarly, the drain or source region (second semiconductor region) 20B having a second impurity of an N conductivity type (predetermined conductivity type) such as phosphorus (P), is formed in a sixth region 55B of the surface 3S of the SOI layer 3. The sixth region 55B is adjacent to the fourth region 54 so as to sandwich the fourth region 54 between the fifth region 55A and itself.

Especially, as shown in FIGS. 15 and 17, the thickness of the peripheral portion of the SOI layer 3 decreases as closer to the end portion 3H of the SOI layer 3, while the thickness of the silicon oxide film (third insulating layer) 6 increases as closer to the end portion 3H of the SOI layer 3 or the interface between the SOI layer 3 and the silicon oxide film 8.

Figure 47:
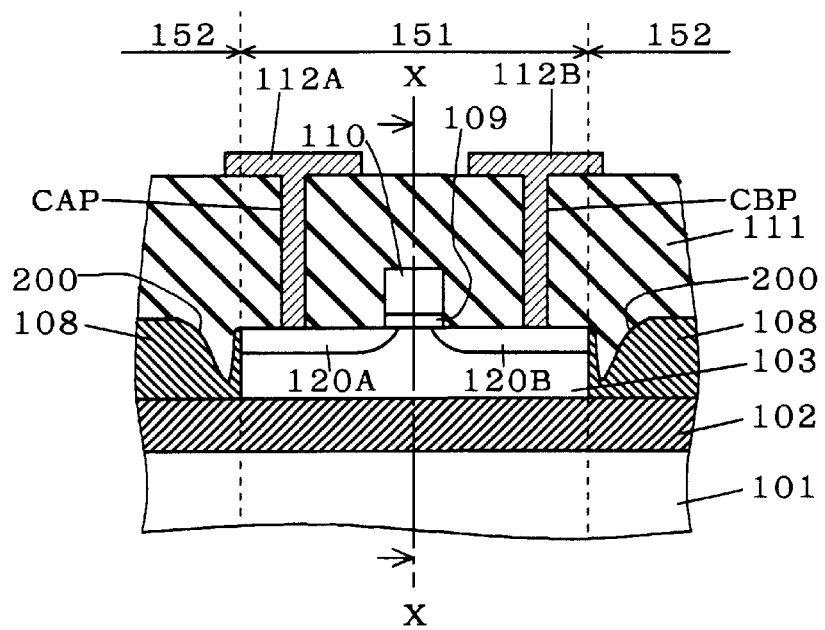
Figure 48:
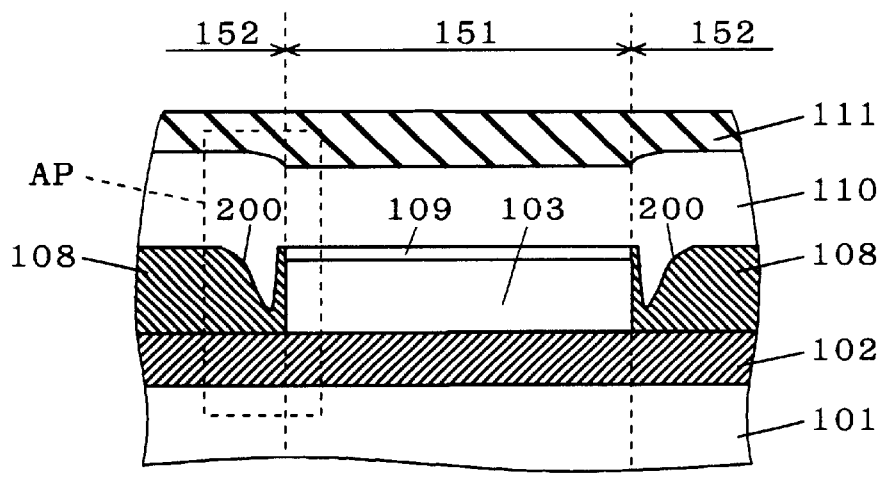
FIG. 48 is a longitudinal cross-sectional view schematically showing the structure of the semiconductor device according to the conventional technique.

Therefore, as shown in FIG. 17, the semiconductor device according to the first preferred embodiment has no depression at the $Si/SiO_2$ interface between the SOI layer 3 and the silicon oxide film 8, which was found in the conventional device shown in FIGS. 47 to 49. This allows the device to prevent formation of the parasitic MOSFET 140T due to the depression 200 (c.f. FIG. 49). Accordingly, the semiconductor device of the first preferred embodiment causes no degradation in insulation of the gate oxide film due to the depression 200 or the parasitic MOSFET 140T.

Further, since the peripheral portion of the SOI layer 3 and the silicon oxide film 6 are in such a shape as described above, concentration of an electric field in the vicinity of the peripheral portion of the SOI layer 3 can be relieved with voltage applied to the gate electrode 10. In this respect, also, the semiconductor device according to the first preferred embodiment can increase reliability of the gate oxide film 9, i.e., reliability of the device itself, as compared with the conventional semiconductor device.

As a result, as compared with the conventional SOI/MOSFET, the semiconductor device (SOI/MOSFET) according to the first preferred embodiment can certainly ensure designed device characteristics.

1-A. First Modification of First Preferred Embodiment

Now, another technique for forming the sidewall 7 in FIG. 5 (corresponding to the aforementioned fourth step) will be described as a first modification of the first preferred embodiment.

1-A-1. Fourth Step of First Modification

Figure 18:
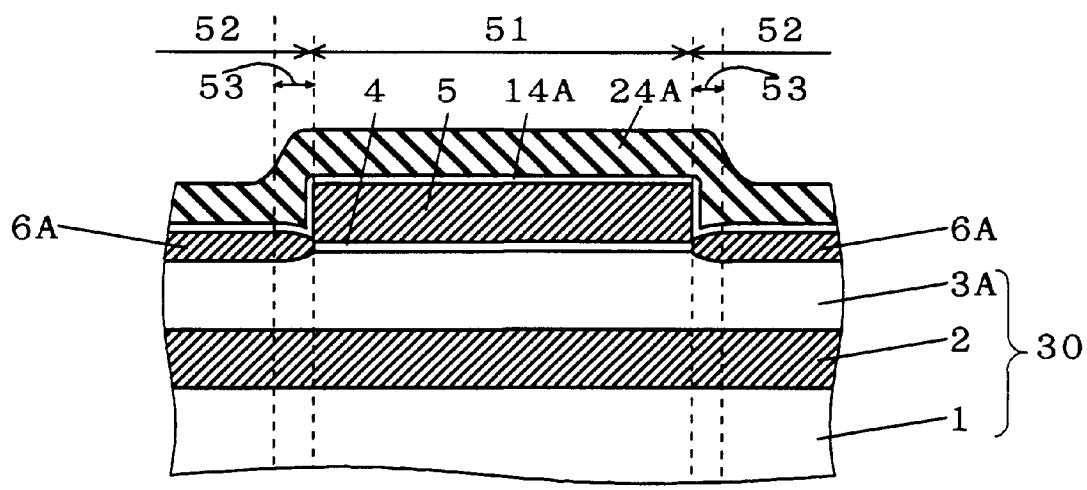
FIGS. 18 and 19 are longitudinal cross-sectional views of a semiconductor device, showing successive stages of a manufacturing method according to a first modification of the first preferred embodiment.

First, as shown in FIG. 18, a silicon oxide film 14A having a thickness of about 100 Å and a silicon oxide film 24A having a thickness of about 400 Å are sequentially deposited across the exposed surface of the semiconductor device after the third step shown in FIG. 4. Especially, the silicon oxide film 14A has a smaller etch rate to hydrofluoric acid than the silicon oxide film 24A. When the silicon oxide film 24A is deposited by the CVD method using TEOS as a material, for example, the silicon oxide film 14A is deposited as a high-temperature oxide film by a CVD method using $SiH_4$ and $N_2O$ as materials, in the condition of about 750° C. to 800° C.

Subsequently, anisotropic etching is applied to the two silicon oxide films 14A and 24A as in the fourth step of the first preferred embodiment, to form a sidewall 71 in a self-alignment manner (see FIG. 19).

Figure 19:
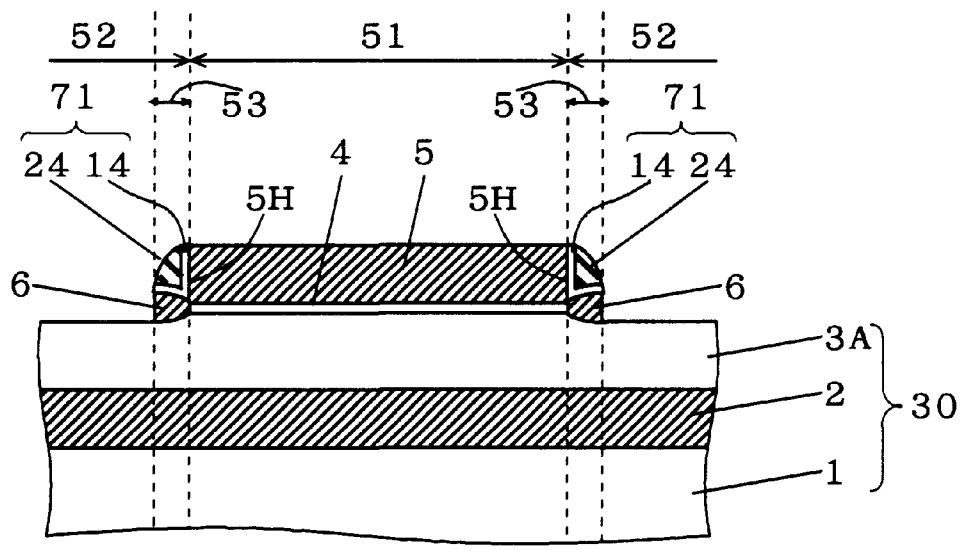

As shown in FIG. 19, the sidewall 71 consists of a first sidewall 14 and a second sidewall 24. Thus, the fourth step according to this first modification includes: a step of forming the first sidewall 14 abutting on the side surface 5H of the stopper film 5, on a first portion (corresponding to a silicon oxide film 6 in FIG. 19) of the silicon oxide film (third insulating layer) 6A (cf. FIG. 18); and a step of forming the second sidewall 24 on the surface of the first sidewall 14.

As to the rest of the manufacturing process after the fifth step, through the same process as in the first preferred embodiment, the semiconductor device shown in FIG. 15 is obtained.

At the fourth step according to the first modification, i.e., the step of forming the sidewall 71, the first sidewall 14 has a smaller etch rate to hydrofluoric acid than the second sidewall 24. Further, the sidewall 71, the silicon oxide film 6, the silicon oxide film 8B (cf. FIG. 8) are integrally joined to each other. Thus, even if the amount of time for the hydrofluoric-acid treatment at the eighth step is set longer than in the first preferred embodiment, it is possible to effectively prevent generation of a depression (cf. depression 200 in FIGS. 44 to 49) at the $Si/SiO_2$ interface between the SOI layer 3 and the silicon oxide film 6 or 8 shown in FIG. 10. Accordingly, the semiconductor device manufactured through the fourth step according to the first modification (cf. FIG. 15) can obtain a similar effect to that of the first preferred embodiment.

In this respect, the sidewall 71 of the first modification can be formed only of a silicon oxide film with a smaller etch rate to hydrofluoric acid than the silicon oxide film 8B shown in FIG. 9, such as the aforementioned high-temperature oxide film. Even in such case, the silicon oxide film 8B is formed to be integrally joined to the sidewall 71 and the silicon oxide film 6. Thus, there occurs no depression. As described above, either manufacturing method brings about the same effect, so that an optimal method can be selected with consideration of a semiconductor device to be manufactured or manufacturing facilities.

1-B. Second Modification of First Preferred Embodiment

Next, another technique for effectively preventing generation of a depression (c.f. depression 200 in FIGS. 44 to 49) during the hydrofluoric-acid treatment at the eighth step, will be described as a second modification of the first preferred embodiment. A manufacturing method according to the second modification is basically similar to the method of the first preferred embodiment, but it is characterized by the eighth step. Thus, we will focus on that step.

1-B-1. Eighth Step of Second Modification

Figure 20:
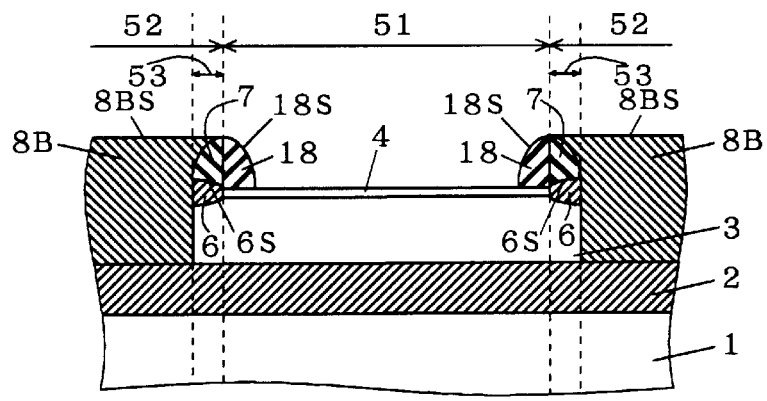
FIG. 20 is a longitudinal cross-sectional view of a semiconductor device, showing a stage of a manufacturing method according to a second modification of the first preferred embodiment.

The feature of this eighth step is that, before the underlying oxide film 4 is removed, a sidewall (third sidewall) 18 is formed to be opposed to the sidewall 7 on the side of the underlying oxide film 4 as shown in FIG. 20. That is, in the semiconductor device shown in FIG. 9, the sidewall 18 is formed on the exposed side surface 7H2 of the sidewall 7 and on the exposed surface 4S of the underlying oxide film 4 in the vicinity of the side surface 7H2.

More specifically, a silicon oxide film having a thickness of about 500 Å is deposited across the exposed surface of the semiconductor device shown in FIG. 9, for example, by the CVD method using TEOS as a material. The silicon oxide film is then anisotropically etched to form the sidewall 18 in a self-alignment manner.

Next, the exposed underlying oxide film (second insulating layer) 4, the side wall 7, the (third) sidewall 18, and part of the silicon oxide film (third insulating film) 8B that ranges from the surface 8BS to the surface 6S of the silicon oxide film 6 abutting on the sidewall 7 are removed as in the eighth step of the first preferred embodiment (cf. FIGS. 9 and 10).

As to the rest of the manufacturing process after the eighth step, through the same process as in the first preferred embodiment, the semiconductor device shown in FIG. 15 is obtained.

In the manufacturing method according to the second modification, the silicon oxide film 6, the silicon oxide film 8B, the sidewall 7, and the sidewall 18 are formed to be integrally joined to each other. Thus, the topmost surface to be wet etched by hydrofluoric acid is the side surface 18S of the sidewall 18. That is, the topmost surface to be etched can be located away from the Si/SiO$_2$ interface between the SOI layer 3 and the silicon oxide film 8B, as compared in the conventional manufacturing method. This allows the Si/SiO$_2$ interface to be fully protected during wet etching, thereby effectively preventing generation of a depression (cf. depression 200 in FIGS. 44 to 49) at the interface. Accordingly, the semiconductor device (cf. FIG. 15) manufactured through the eighth step of the second modification has the same effect as the device of the first preferred embodiment.

2. Second Preferred Embodiment

We will now describe a semiconductor device and a method of manufacturing the device according to a second preferred embodiment. This method is based on the method of the first preferred embodiment. Thus, a description of the method will be given with emphasis on the features of the method to clarify the features of the semiconductor device according to the second preferred embodiment. In the drawings, the same reference numerals and characters indicate the same components as those in the first preferred embodiment, and descriptions thereof will be omitted.

2-1. First to Fourth Steps

The first through fourth steps in the manufacturing method according to the second preferred embodiment are similar to those of the first preferred embodiment.

More specifically, as shown in FIGS. 1 and 2, the SOI substrate 30 is prepared, and the underlying oxide film 4A and the stopper film (silicon nitride film) 5A are sequentially deposited on the surface 3AS of the SOI substrate 30. Then, as shown in FIG. 3, the silicon nitride film 5A and the underlying oxide film 4A are patterned by photolithography and dry etching to form the stopper film 5 and the underlying oxide film 4.

After that, as shown in FIG. 4, the surface 3AS (cf. FIG. 3) of the SOI layer 3A in the second region 52 is oxidized to form the silicon oxide film 6A. Then, the sidewall 7 is formed as shown in FIG. 5. The formation of the sidewall 7 can be conducted by the fourth step of the first modification, instead of the fourth step of the first preferred embodiment.

2-2. Fifth Step

Next, the semiconductor device after the fourth step, shown in FIG. 5, is dry etched on the condition of anisotropic etching that the sidewall 7 and the stopper film 5 are used as masks, as in the method of the first preferred embodiment. This removes the second portion of the SOI layer 3A in the second region 52 except the third region 53 (c.f. FIG. 6).

Figure 21:
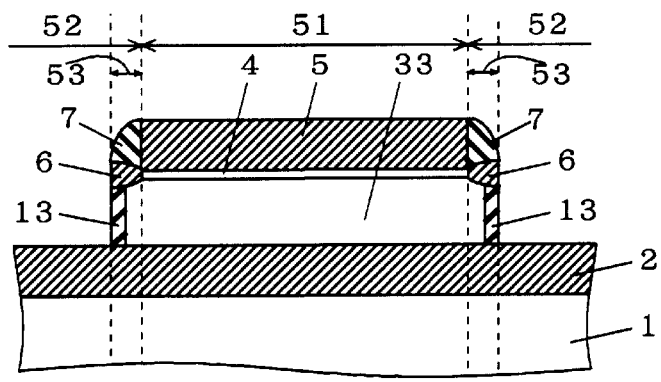
FIGS. 21 to 26 are longitudinal cross-sectional views of a semiconductor device, showing successive stages of a manufacturing method according to a second preferred embodiment of the present invention.

Especially in the method according to this preferred embodiment, thermal oxidation is applied to the semiconductor device shown FIG. 6 to oxidize the side surface (end portion) 3H of the SOI layer 3, thereby forming a silicon oxide film 13 as shown in FIG. 21. This oxidation removes the side surface or end portion 3H (c.f. FIG. 6) of the SOI layer 3 which is damaged by dry etching at this fifth step, and allows that portion to be covered by the silicon oxide film of good quality 13 formed by thermal oxidation. In the following description, the SOI layer 3 after this oxidation is referred to as an "SOI layer (semiconductor layer) 33".

2-3. Sixth to Eleventh Steps

For the semiconductor device shown in FIG. 21, the same process as to the sixth to eleventh steps of the first preferred embodiment is applied.

Figure 22:
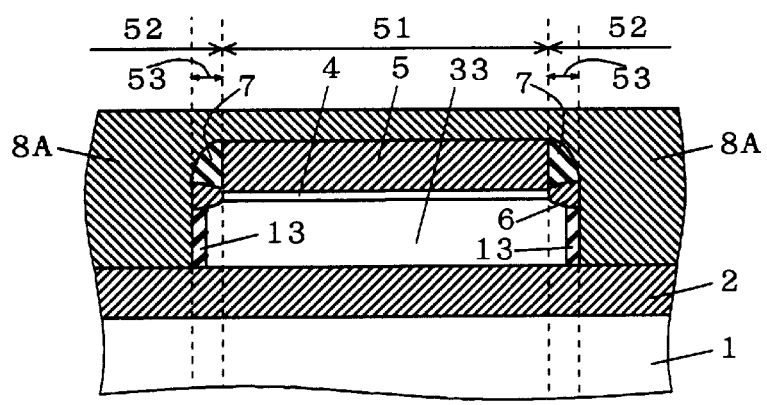
Figure 23:
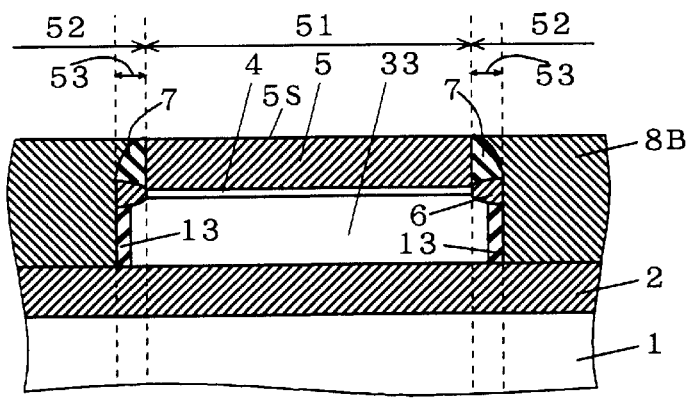
Figure 24:
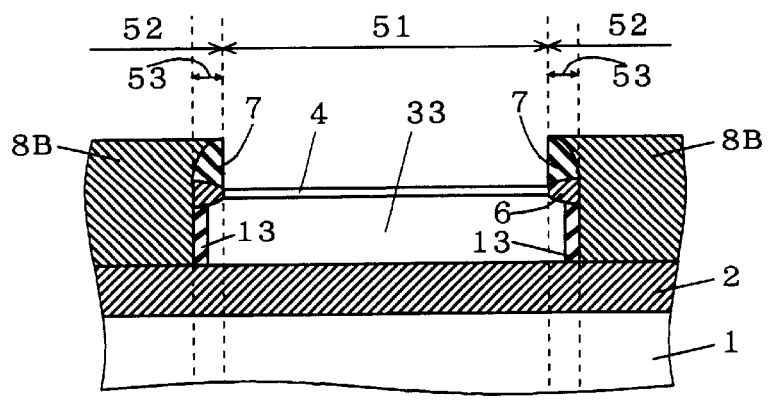

More specifically, as shown in FIG. 22, the silicon oxide film 8A is deposited to cover the overall exposed surface of the semiconductor device shown in FIG. 21. The silicon oxide film 8A is then polished for planarization by the CMP method using the silicon nitride film as a stopper film, as shown in FIG. 23, to the extent that the surface 5S of the silicon nitride film 5 is exposed. After that, only the silicon nitride film 5 is removed by phosphoric acid (see FIG. 25).

Then, annealing is applied to the SOI layer 33 after an impurity such as boron (B) is implanted therein through the underlying oxide film 4. This forms a P conductive type (second conductivity type) of SOI layer 33.

Figure 25:
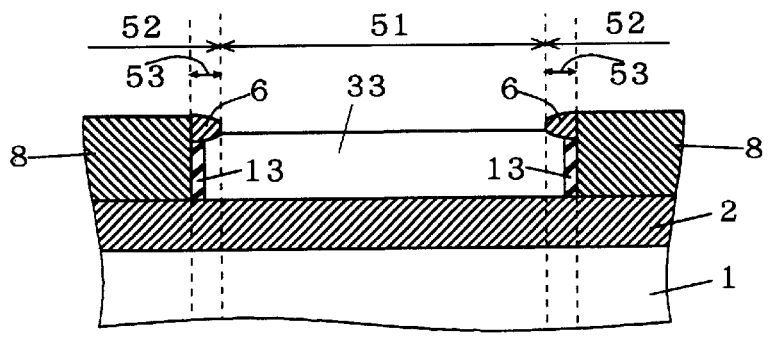

After that, the exposed underlying oxide film 4, the sidewalls 7, and part of the silicon oxide film 8B described before are removed by wet etching using hydrofluoric acid (see FIG. 25). At this time, the silicon oxide film (third insulating layer) 6 brings about a similar effect to that of the first preferred embodiment.

Figure 26:
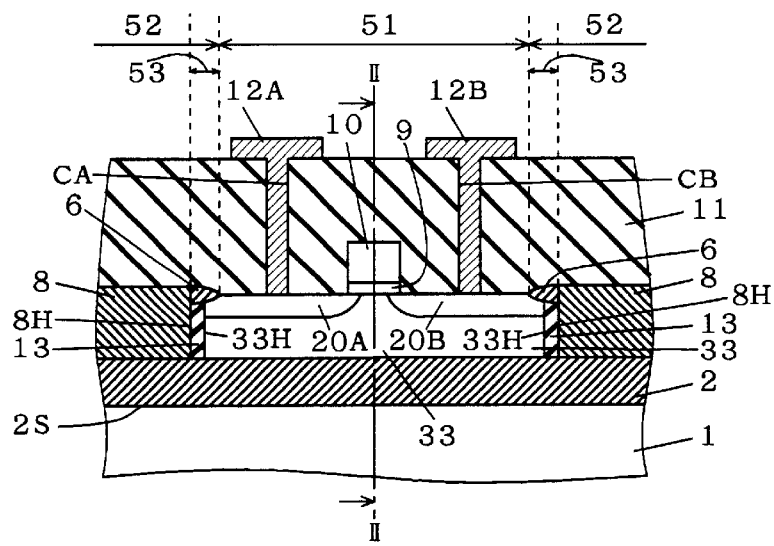

As to the rest of the manufacturing process from the ninth to eleventh steps, through the same process as in the first preferred embodiment, the semiconductor device shown in FIG. 26 is obtained.

Figure 27:
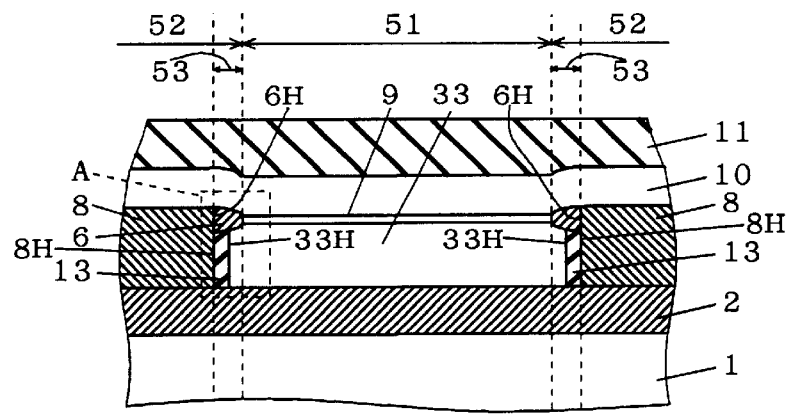
FIG. 27 is a longitudinal cross-sectional view schematically showing the structure of the semiconductor device according to the second preferred embodiment.
Figure 28:
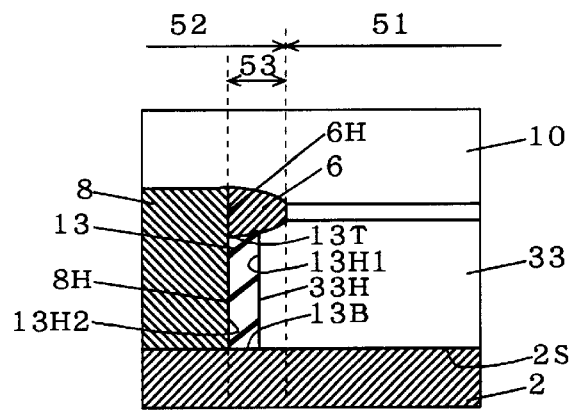
FIG. 28 is an enlarged longitudinal cross-sectional view schematically showing the main structure of the semiconductor device according to the second preferred embodiment.

The features of the semiconductor device (SOI/MOSFET) according to the second preferred embodiment will be described, referring to FIGS. 26 to 28. FIG. 27 is a longitudinal cross-sectional view taken along a line II—II in FIG. 26, when viewed from the direction of the arrow. FIG. 28 is an enlarged longitudinal cross-sectional view of a region A indicated by dashed lines in FIG. 27.

The semiconductor device according to this preferred embodiment has basically the same structure as that of the first preferred embodiment (cf. FIGS. 15 to 17).

Especially in the semiconductor device according to this preferred embodiment, as shown in FIGS. 26 to 28, the silicon oxide film (i.e. a fifth insulating layer) 13 is formed on the end portion or side surface 33H of the SOI layer (semiconductor layer) 33, and on the second region 52 of the surface 2S of the buried oxide film (first insulating layer) 2 in the vicinity of the end portion 33H. The silicon oxide film 13 has a first side surface 13H1 joined to the end portion 33H of the SOI layer 33, and a second side surface 13H2 opposed to the first side surface 13H1. The second side surface 13H2 of the silicon oxide films 13 is integrally joined to the side surface 8H of the silicon oxide film (second insulating layer) 8 on the side of the SOI layer 33. Furthermore, on the top surface 13T of the silicon oxide film 13 which is opposed to the bottom surface 13B forming an interface along with the surface 2S of the buried oxide film 2, the silicon oxide film (third insulating layer) 6 is extended from the end portion 33H of the SOI layer 33. And the end portion 6H of the silicon oxide film 6 is integrally joined to the side surface 8H of the silicon oxide film 8.

Therefore, the semiconductor device according to the second preferred embodiment can lead to the following effect as well as the effect of the first preferred embodiment. That is, since the end portion (side surface) 33H of the SOI layer 33 is covered by the silicon oxide film 13, the SOI layer 33 is not in direct contact with the silicon oxide film 8 which is formed by deposition such as a CVD method using TEOS as a material, unlike the conventional semiconductor device shown in FIG. 47 or 49. The silicon oxide film 13 in direct contact with the SOI layer 33 is, on the other hand, formed by thermal oxidation, so that it has the advantages of being dense as compared with the silicon oxide film 8 and causing less interface state at the $Si/SiO_2$ interface between the end portion (side surface) 33H of the SOI layer 33 and its first side surface 13H1. For this reason, even if there is a depression (cf. depression 200 in FIGS. 47 to 49) at the interface between the side surface 8H of the silicon oxide film 8 and the side surface 6H or 13H2 of the silicon oxide film 6 or 13 shown in FIGS. 26 to 28, such a case as shown in FIGS. 47 to 49 will never happen where the electric field applied between the bottom of the depression 200 and the SOI layer 103 (corresponding to the SOI layer 33) causes degradation in insulation of the silicon oxide film 109 (corresponding to the silicon oxide film 13) between the bottom of the depression 200 and the SOI layer 103. Accordingly, there is no possibility in the semiconductor device of this preferred embodiment that the real MOSFET 140S loses its device characteristics due to degradation in insulation of the parasitic MOSFET 140T in the conventional semiconductor device shown in FIG. 49. In other words, the semiconductor device (SOI/MOSFET) according to this preferred embodiment can certainly ensure designed device characteristics.

Figure 40:
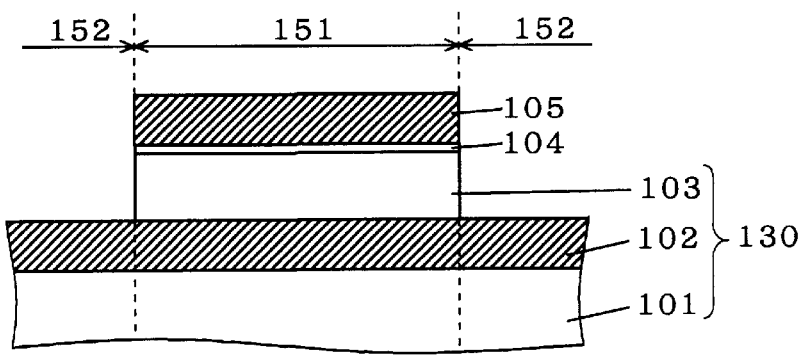
Figure 41:
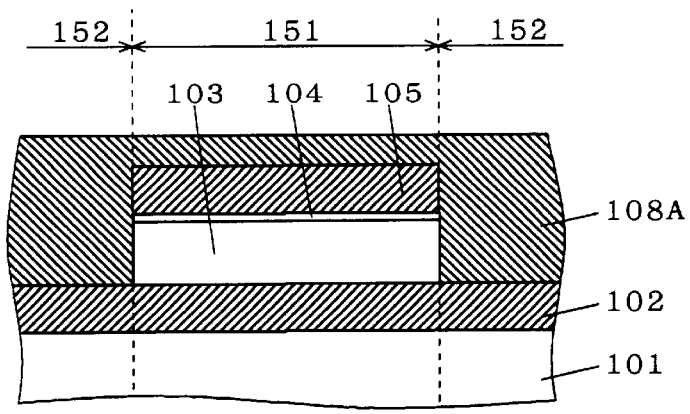
Figure 42:
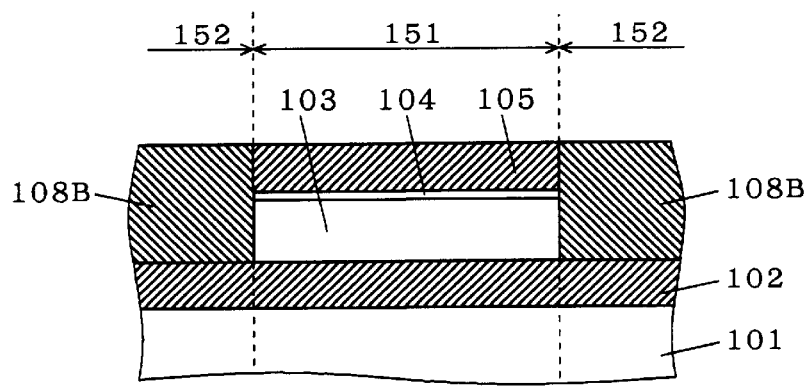
Figure 43:
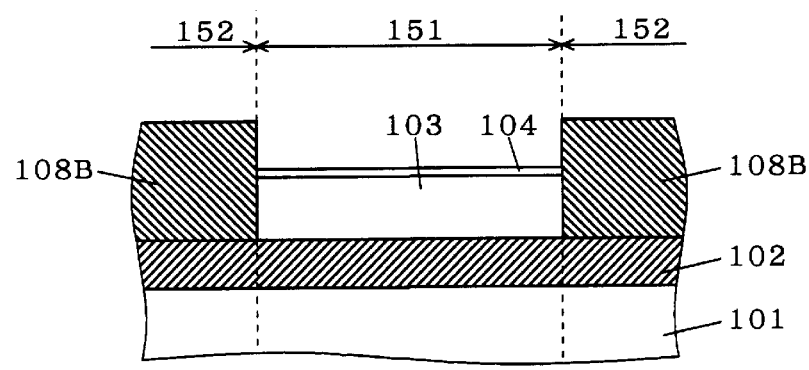

It is possible to apply the fifth step of the second preferred embodiment to the conventional manufacturing method, i.e., the semiconductor device shown in FIG. 40. In such case, the device can also obtain a similar effect to that of the second preferred embodiment. However, the manufacturing method of the second preferred embodiment which is based on the method of the first preferred embodiment, is advantageous to the conventional method in that it can more effectively prevent generation of a depression (cf. depression 200 in FIGS. 47 to 49).

2-A. First Modification of Second Preferred Embodiment

Next, a method of forming a silicon oxide film 17 (cf. FIG. 35) having the same function and effect as the silicon oxide film 13, between the SOI layer 3 and the silicon oxide film 8 shown in FIGS. 15 or 17, will be described as a first modification of the second preferred embodiment.

First, through the same process as the first to fifth steps of the first preferred embodiment, the semiconductor device shown in FIG. 6 is obtained.

Figure 29:
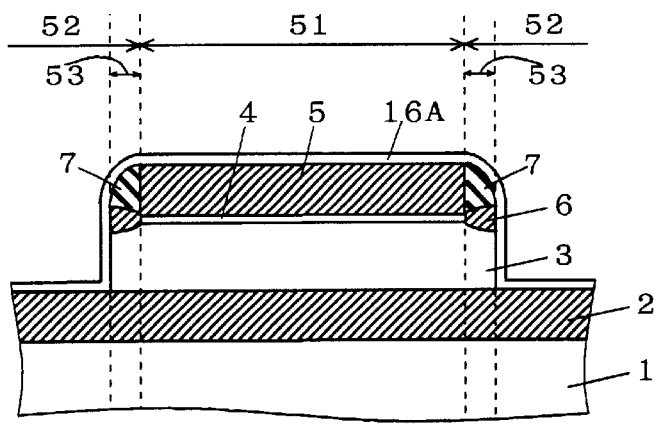
FIGS. 29 to 34 are longitudinal cross-sectional views of a semiconductor device, showing successive stages of a manufacturing method according to a first modification of the second preferred embodiment.

Then, as shown in FIG. 29, a polysilicon film 16A having a thickness of about 100 Å is deposited across the exposed surfaces of the buried oxide film 2, the SOI layer 3, the silicon oxide films 6, the sidewalls 7, and the stopper film 5.

Figure 30:
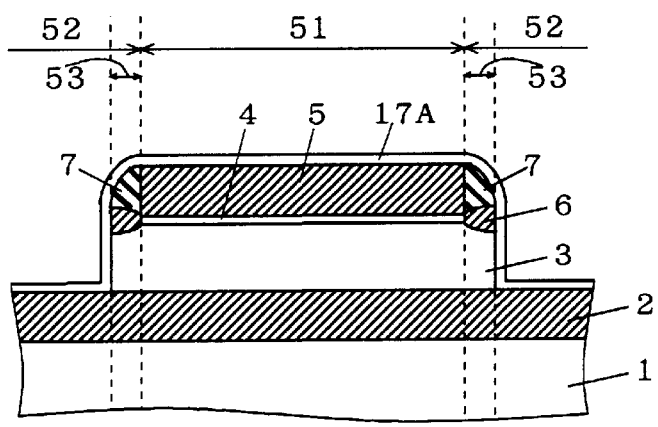

The polysilicon film 16A is then all thermally oxidized to form a silicon oxide film 17A as shown in FIG. 30.

As to the rest of the manufacturing process thereafter, the same process as the sixth to eleventh steps of the first preferred embodiment is employed.

Figure 31:
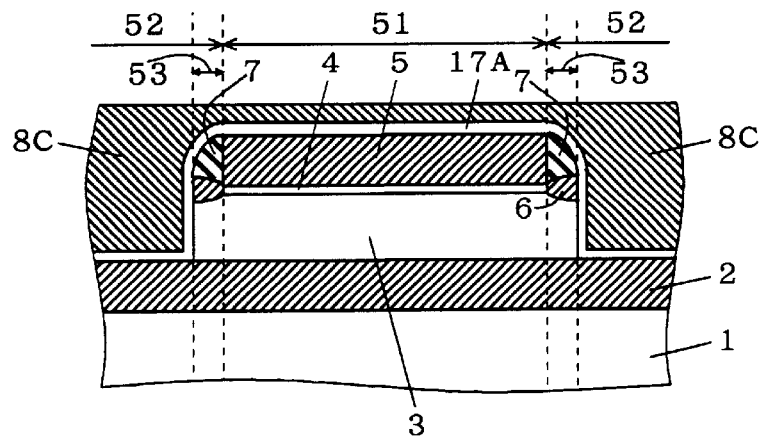
Figure 32:
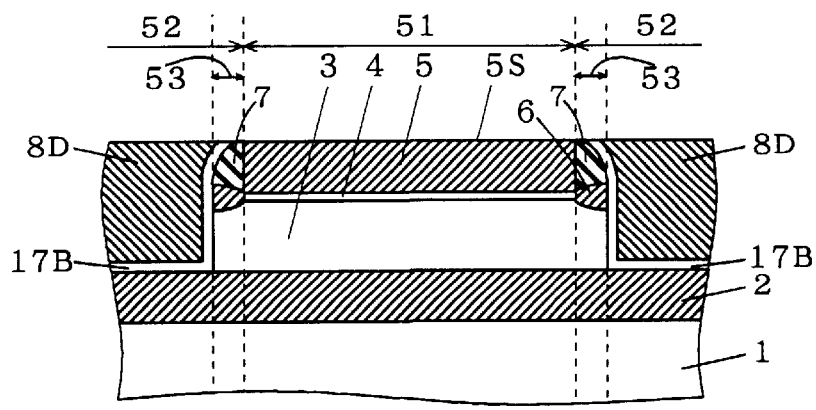

More specifically, as shown in FIG. 31, a silicon oxide film 8C is deposited to cover the overall exposed surface of the semiconductor device shown in FIG. 30. Subsequently, the silicon oxide film 8C and the silicon oxide film 17A (cf. FIG. 31) are polished for planarization by a CMP method using the silicon nitride film 5 as a stopper film, to the extent that the surface 5S of the silicon nitride film 5 is exposed. In the following description, the residual silicon oxide film 17A and residual silicon oxide film 8C after this polishing are referred to as a "silicon oxide film 17B" and a "silicon oxide film 8D", respectively. Then, only the silicon nitride film 5 is removed by phosphoric acid (see FIG. 33).

Then, annealing is applied to the SOI layer 3 after an impurity such as boron (B) is implanted therein through the underlying oxide film 4. This forms a P conductivity type (second conductivity type) of SOI layer 3.

Figure 33:
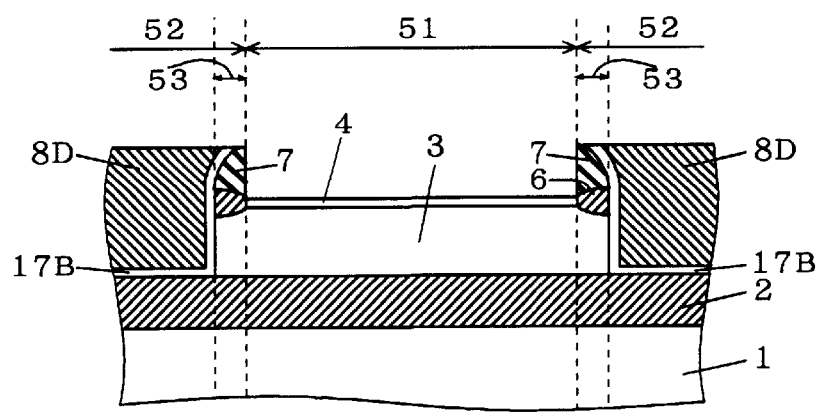
Figure 34:
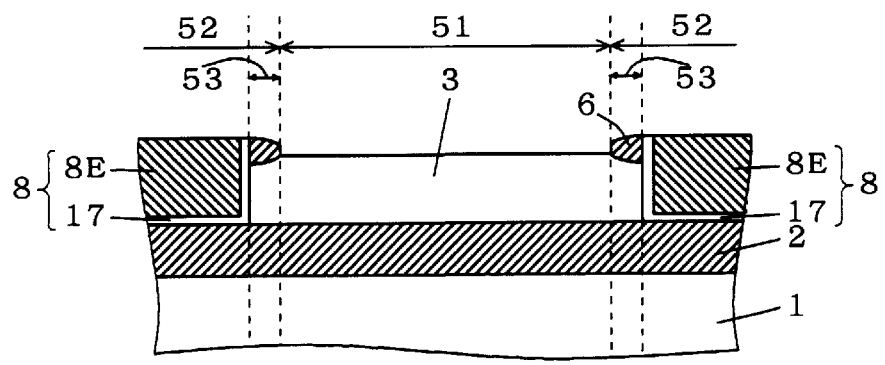

After that, the exposed underlying oxide film 4, the sidewalls 7, and part of the silicon oxide film 8D and the silicon oxide film 17B that ranges from the exposed surface to the surface 6S (cf. FIG. 9) of the silicon oxide film 6, all shown in FIG. 33, are removed by wet etching using hydrofluoric acid (see FIG. 34). The residual silicon oxide film 17B and the residual silicon oxide film 8D after this removal are referred to as a "silicon oxide film 17" and a "silicon oxide film 8E", respectively. At this time, the silicon oxide film 17 and the silicon oxide film 8E in combination can be taken as the silicon oxide film 8 shown in FIG. 10.

Figure 35:
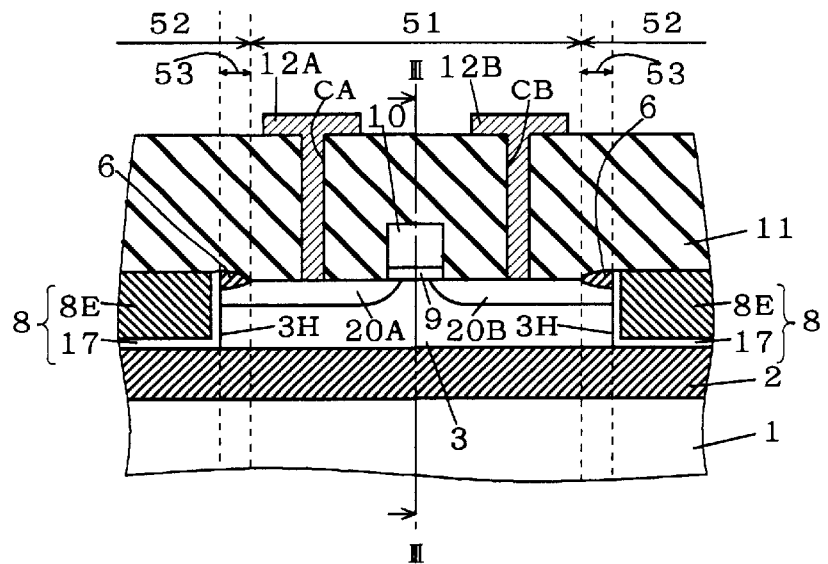
FIGS. 35 and 36 are longitudinal cross-sectional views schematically showing the structure of the semiconductor device according to the first modification of the second preferred embodiment.

As to the rest of the manufacturing process thereafter, through the same process as the ninth to eleventh steps of the first preferred embodiment, the semiconductor device shown in FIG. 35 is obtained.

Figure 36:
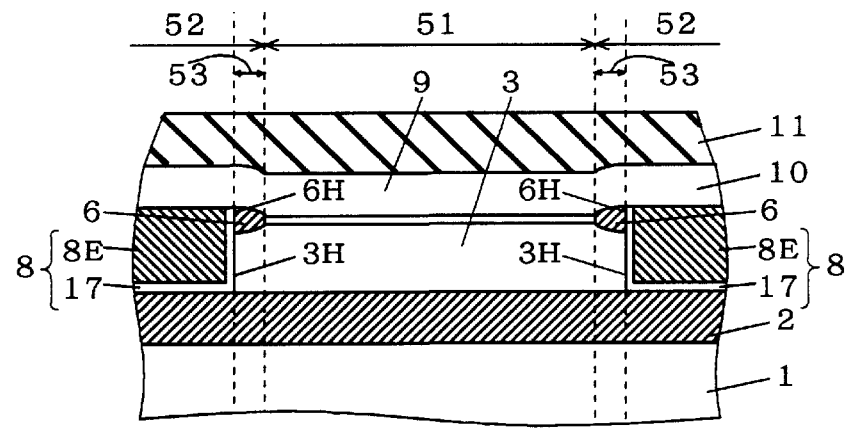
Figure 37:
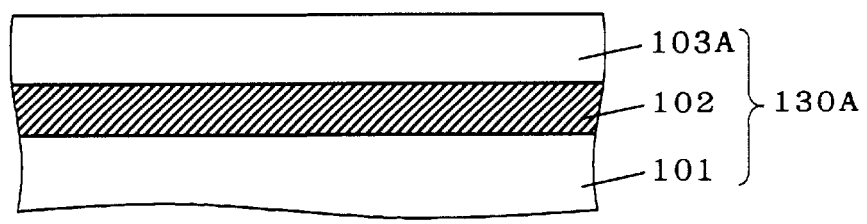
FIGS. 37 to 47 are longitudinal cross-sectional views of a semiconductor device, showing successive stages of a manufacturing method according to a conventional technique.
Figure 38:
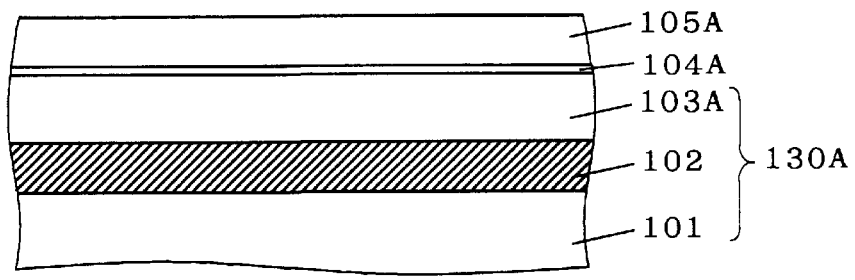
Figure 39:
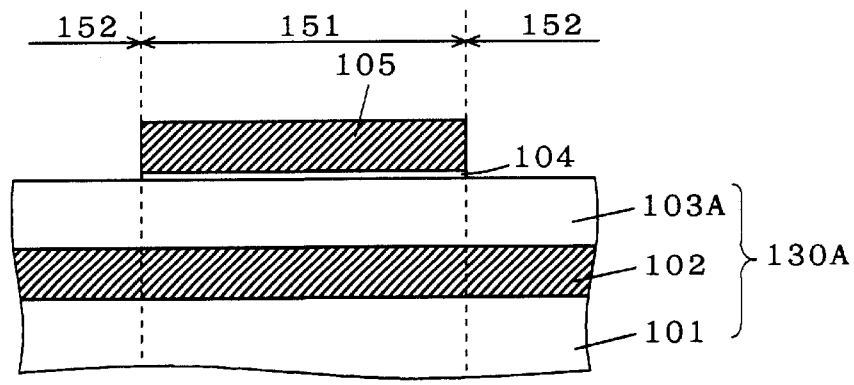

Referring to FIGS. 35 and 36, we will now describe the features of the semiconductor device (SOI/MOSFET) according to this modification. FIG. 36 is a longitudinal cross-sectional view taken along a line III—III in FIG. 35, when viewed from the direction of the arrow.

The semiconductor device of this modification has the same basic structure as the device of the first preferred embodiment (cf. FIGS. 15 to 17).

Especially in the device according to this modification, as shown in FIGS. 35 and 36, the silicon oxide film (sixth insulating layer) 17 is formed at least on the end portion 3H of the SOI layer (semiconductor layer) 3 and on the end portion 6H of the silicon oxide film (third insulating layer) 6 which is integrally joined to the silicon oxide film 17. Further, the silicon oxide film (seventh insulating layer) 8E is formed to be adjacent to and integrally joined to the silicon oxide film 17. At this time, the silicon oxide film (sixth insulating layer) 17 and the silicon oxide film (seventh insulating layer) 8E in combination can be taken as the silicon oxide film (second insulating layer) 8 according to the first and the second preferred embodiment, thus the second insulating layer includes the sixth insulating layer and the seventh insulating layer.

Thus, in the semiconductor device according to this modification, there exists the silicon oxide film 17 between the SOI layer 3 and the silicon oxide film 8E formed by deposition such as a CVD method using TEOS as a material, as shown in FIGS. 35 and 36. This prevents a direct contact of the SOI layer 3 with the silicon oxide film 8E. Thus, the semiconductor device of this modification can obtain a similar effect to that of the second preferred embodiment.

The aforementioned silicon oxide film 17 may be deposited immediately as a high-temperature oxide film having a thickness of about 100 Å, by a CVD method using $SiH_4$ and $N_2O$ as materials, in the condition of 750° C. to 800° C. Such a high-temperature oxide film or silicon oxide film 17 has a smaller etch rate to hydrofluoric acid than the silicon oxide film 8 (8E) which is deposited by a CVD method using TEOS as a material. Since the etch rate depends on the quality of the silicon oxide film, having a small etch rate indicates that the silicon oxide film has a fine structure (composition) and can obtain less interface state when it forms an interface with silicon. Thus, when the silicon oxide film is formed as a high-temperature oxide film, the device can obtain the same effect as described above.

While the silicon oxide film (third insulating layer) 6 is formed across the peripheral portion of the SOI layer 3 or 33 in the semiconductor devices or in the manufacturing methods according to the first and the second preferred embodiments, it is obvious that the aforementioned effects can be obtained only if the silicon oxide film 6 is formed on the end portion of the SOI layer 3 or 33 located under a region where the gate electrode layer 10 is to be formed.

Further, each of the manufacturing methods according to the first and second preferred embodiments and the modifications thereof can be used not only by itself but also in combination with the features of the other methods. For example, the method of the second preferred embodiment can introduce the advantages of the first and the second modifications of the first preferred embodiment that are obtained with the sidewalls 71 and 18. In such case, generation of a depression (cf. depression 200 in FIGS. 44 to 49) causing a parasitic MOSFET (cf. 140T in FIG. 49) can be completely prevented. This allows the semiconductor device to ensure designed device characteristics.

While the invention has been described in detail, the foregoing description is in all aspects illustrative and not restrictive. It is understood that numerous other modifications and variations can be devised without departing from the scope of the invention.

We claim:

1. A semiconductor device comprising:

a first insulating layer;

a semiconductor layer formed on a first region and a part of a second region of a surface of said first insulating layer, said second region being adjacent to said first region;

a second insulating layer formed on said second region of said surface of said first insulating layer;

a third insulating layer formed on a third region on a peripheral portion of said semiconductor layer, said third insulating layer having an end portion integrally joined to said second insulating layer adjacent thereto;

a fourth insulating layer formed on a fourth region of a surface of said semiconductor layer, and longitudinally extending to said third insulating layer, said fourth insulating layer having an end portion integrally joined to said third insulating layer, said fourth region being opposed to said first region and surrounded by said peripheral portion of said semiconductor layer;

a control electrode layer formed on a surface of said fourth insulating layer and on a portion where said third insulating layer is integrally joined to said fourth insulating layer;

a first semiconductor region having a predetermined conductivity type, formed in a fifth region of said surface of said semiconductor layer, said fifth region being adjacent to said fourth region; and a second semiconductor region having said predetermined conductivity type, formed in a sixth region of said surface of said semiconductor layer, said sixth region being adjacent to said fourth region so as to sandwich said fourth region between said fifth and sixth regions, wherein the thickness of said peripheral portion of said semiconductor layer decreases near an end portion of said semiconductor layer, wherein the thickness of said third insulating layer increases near said end portion of said semiconductor layer.

2. The semiconductor device of claim 1, further comprising:

a fifth insulating layer formed on said end portion of said semiconductor layer and on said second region of said surface of said first insulating layer in the vicinity of said end portion of said semiconductor layer;

said fifth insulating layer having a first side surface joined to said end portion of said semiconductor layer, and a second side surface opposed to said first side surface, said second side surface integrally joined to a side surface of said second insulating layer on the side of said semiconductor layer; and said fifth insulating layer having a top surface opposed to a bottom surface forming an interface along with said surface of said first insulating layer, wherein said third insulating layer is extended from said end portion of said semiconductor layer and formed on said top surface of said fifth insulating layer, and said end portion of said third insulating layer is integrally joined to said side surface of said second insulating layer.

3. The semiconductor device of claim 1, wherein said second insulating layer comprises a sixth insulating layer and a seventh insulating layer, said sixth insulating layer formed at least on said end portion of said semiconductor layer and on said end portion of said third insulating layer, and integrally joined to said third insulating layer, said seventh insulating layer formed to be adjacent to and integrally joined to said sixth insulating layer.

4. A semiconductor device comprising:

a semiconductor substrate;

a first insulating layer formed on a surface of said semiconductor substrate;

a semiconductor layer formed on a surface of said first insulating layer and having a side surface and a top surface;

source/drain regions formed at a predetermined distance from each other in said top surface of said semiconductor layer;

a gate electrode formed, with a gate insulating film sandwiched in between, on a region of said top surface of said semiconductor layer which is sandwiched between said source/drain regions; and a second insulating layer having a trench isolation structure and formed on a surface of said first insulating layer to surround said side surface of said semiconductor layer, wherein said second insulating layer has, on said top surface of said semiconductor layer, a peripheral portion extending toward the inside of said side surface of said semiconductor layer, a thickness of said semiconductor layer decreases near said side surface, a thickness of said peripheral portion of said second insulating layer increases near said side surface of said semiconductor layer, and an intersection of said side surface of the semiconductor layer and an interface between said peripheral portion of said second insulating layer and said semiconductor layer is formed at a shallower depth than a bottom-most depth of said source/drain regions.

5. The semiconductor device according to claim 4, further comprising:
a third insulating layer formed at an interface between said side surface of said semiconductor layer and said second insulating layer.

6. The semiconductor device according to claim 4, wherein said second insulating layer includes a first film and a second film, said first film covering at least said side surface of said semiconductor layer and including said peripheral portion of said second insulating, said second film filling a trench formed with said first insulating layer and said side surface of said semiconductor layer.

* * * * *